(12) United States Patent
Gong et al.

(10) Patent No.: US 11,139,851 B2
(45) Date of Patent: Oct. 5, 2021

(54) FREQUENCY INDEPENDENCE FOR SYNTHESIS WITHIN PROGRAMMABLE NON-RECIPROCAL NETWORK CIRCUIT

(71) Applicant: Board of Trustees of the University of Illinois, Urbana, IL (US)

(72) Inventors: Songbin Gong, Champaign, IL (US); Ruochen Lu, Champaign, IL (US); John Andrew Krol, Manhattan, IL (US); Liuqing Gao, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 17/081,377

(22) Filed: Oct. 27, 2020

(65) Prior Publication Data
US 2021/0111747 A1 Apr. 15, 2021

Related U.S. Application Data

(63) Continuation of application No. 16/396,024, filed on Apr. 26, 2019, now Pat. No. 10,868,576.
(Continued)

(51) Int. Cl.
*H04B 1/40* (2015.01)
*H03K 5/14* (2014.01)
(Continued)

(52) U.S. Cl.
CPC ............... *H04B 1/40* (2013.01); *H01P 1/387* (2013.01); *H03H 9/74* (2013.01); *H03K 5/135* (2013.01);
(Continued)

(58) Field of Classification Search
None
See application file for complete search history.

(56) References Cited

U.S. PATENT DOCUMENTS 3,484,689 A 12/1969 Kerns
3,787,852 A 1/1974 Puckette et al.
(Continued)

OTHER PUBLICATIONS

Adam, J.D., Davis, L.E., Dionne, G.F., Schloemann, E.F., & Stitzer, S.N., "Ferrite Devices and Materials," IEEE Transactions on Microwave Theory and Techniques vol. 50, No. 3, pp. 721-737, Mar. 2002.
(Continued)

*Primary Examiner* — Lincoln D Donovan
*Assistant Examiner* — Khareem E Almo
(74) *Attorney, Agent, or Firm* — Lowenstein Sandler LLP

(57) ABSTRACT

An apparatus includes parallel delay lines, each exhibiting a delay; a first set of switches for each port of a first set of ports, each of which is to selectively couple a port of the first set of ports to first ends of the delay lines; a second set of switches for each port of a second set of ports, each of which to selectively couple a port of the second set of ports to second ends of the delay lines. A signal source generates a series of clock signals that are sequentially time delayed between the first set of switches and the second set of switches, where an input signal at one of the first or second sets of ports travels back and forth across the first and second sets of delay lines according to activation of the first set and second set of switches until being output.

20 Claims, 17 Drawing Sheets

Related U.S. Application Data

(60) Provisional application No. 62/663,523, filed on Apr. 27, 2018.

(51) Int. Cl.
*H01P 1/387* (2006.01)
*H03H 9/74* (2006.01)
*H03K 5/135* (2006.01)
*H03K 5/00* (2006.01)

(52) U.S. Cl.
CPC ..... *H03K 5/14* (2013.01); *H03K 2005/00078* (2013.01)

(56) References Cited

U.S. PATENT DOCUMENTS

| | | | |
|---|---|---|---|
| 4,376,957 A | 3/1983 | Dischert et al. | |
| 4,410,981 A | 10/1983 | Flory | |
| 4,580,173 A * | 4/1986 | Dischert | H04N 9/82 348/470 |
| 4,791,360 A | 12/1988 | Gagnon et al. | |
| 4,801,901 A | 1/1989 | Ayasli | |
| 5,115,428 A | 5/1992 | Ramanan et al. | |
| 5,313,177 A | 5/1994 | Hickernell et al. | |
| 5,777,419 A | 7/1998 | Penunuri | |
| 6,307,681 B1 | 10/2001 | Aoki et al. | |
| 8,941,420 B2 * | 1/2015 | Zerbe | H03L 7/16 327/119 |
| 10,536,186 B1 * | 1/2020 | Zihir | H04B 1/18 |
| 2009/0256633 A1 | 10/2009 | Emdadi | |
| 2013/0182620 A1 * | 7/2013 | Chaffee | H04B 10/503 370/310 |
| 2016/0204813 A1 * | 7/2016 | Mu | H04B 1/06 455/343.1 |
| 2016/0341780 A1 * | 11/2016 | McLeod | H03K 19/017527 |
| 2017/0134015 A1 | 5/2017 | Papananos et al. | |
| 2017/0230028 A1 | 8/2017 | Gamal El Din et al. | |
| 2017/0331168 A1 | 11/2017 | Wang | |
| 2018/0123705 A1 * | 5/2018 | Henry | H04B 17/0085 |
| 2018/0294547 A1 * | 10/2018 | Park | H04B 7/0802 |
| 2019/0007051 A1 * | 1/2019 | Sete | G06N 10/00 |
| 2019/0027822 A1 | 1/2019 | Ayala Vazquez et al. | |
| 2019/0334568 A1 * | 10/2019 | Gong | H03K 5/135 |
| 2019/0386397 A1 | 12/2019 | Son et al. | |
| 2019/0393918 A1 | 12/2019 | Han et al. | |
| 2020/0195240 A1 | 6/2020 | Lim et al. | |
| 2020/0213166 A1 | 7/2020 | Kim et al. | |
| 2020/0321994 A1 * | 10/2020 | Alam | H04L 25/0292 |

OTHER PUBLICATIONS

Barzanjeh S. et al., "Mechanical On-Chip Microwave Circulator," Nature Communications 8:953, DOI: 10.1038/s41467-17-01304-x, 2017.
Bharadia, D. McMilin, E. & Katti, S., "Full Duplex Radios," Proc. ACM SIGCOMM, 2013 43, pp. 375-386, 2013.
Biedka, M.M., Zhu, R., Xu, Q.M, & Wang, Y.E., "Ultra-Wide Band Non-Reciprocity Through Sequentially-Switched Delay Lines," Scientific Reports 7:40014, DOI:10.1038/srep40014, publsihed Jan. 6, 2017.
Chappen, W.J., Naglich, E.J., Maxey, C., & Guyette, A.C., "Putting the Radio in 'Software-Defined Radio': Hardware Developments for Adaptable RF Systems," Proc. IEEE vol. 102, No. 3, pp. 307-320, Mar. 2014.
Dinc, T. et al., "Synchronized Conductivity Modulation to Realize Broadband Lossless Magnetic-Free Nonreciprocity," Nature Communication 8:795, DOI:10.1038/s4167-017-00798-9, pp. 1-9, 2017.
Estep, N.A., Sounas, D.L., & Alu, A., "Magnetless Microwave Circulators Based on Spatiotemporally Modulated Rings of Coupled Resonators," IEEE Transactions on Microwave Theory and Techniques, vol. 64, No. 2, pp. 502-518, Feb. 2016.
Estep, N.A., Sounas, D.L., Soric, J., & Alu, A., "Magnetic-Free Non-Reciprocity and Isolation Based on Parametrically Modulated Coupled-Resonator Loops," Nature Physic vol. 10, pp. 923-927, published online Nov. 10, 2014.
Fleury, R., Khanikaev, A.B., & Alu, A., "Floquet Topological Insulators for Sound," Nature Communications 7:11744, DOI: 10.1038/ncomms11744, pp. 1-11, Published Jun. 17, 2016.
Ghaffari, A., Klumperink, E.A.M., Soer, M.C.M., & Nauta, B., "Tunable High-Q N-Path Band-Pass Filters: Modeling and Verification," IEEE Journal of Solid-State Circuits, vol. 46, No. 5 pp. 998-1010, May 2011.
Gong, S., Shen, H., & Barker, N.S., "A 60-GHz 2-Bit Switched-Line Phase Shifter Using SP4T RF-MEMS Switches," IEEE Transactions Microwave Theroy and Techniques, vol. 59, No. 4, pp. 894-900, Apr. 2011.
Kerckhoff, J. Lalumiere, K. Chapman, B.J., Blais, A., & Lehnert, K.W., "On-Chip Superconducting Microwave Circulator from Synthetic Rotation," Physical Review Applied 4, pp. 034002-1-034002-14, 2015.
Krol, J. & Gong, S., "A Non-Magnetic Gyrator Utilizing Switched Delay Lines," Proceeding of the 47th European Microwave Conference (EuMC). Nuremberg, Germany, p. 452-455, Oct. 10-12, 2017.
Liu, X., Katehi, L.P.B., Chappell, W.J., & Peroulis, D., "High-Q Tunable Microwave Cavity Resonators and Filters Using SOI-Based RF MEMS Tuners," Journal Microelectromechanical System, 19, pp. 774-784, Feb. 2010.
Lu, R., et al., "A Frequency Independent Framework for Synthesis of Programmable Non-Recciprocal Networks," Scientific Reports, 8:14655, DOI:10.1038/s41598-018-32898-x, pp. 1-7, published online Oct. 2, 2018.
Lu, R., et al., "A Radio Frequency Non-Reciprocal Network Based on Switched Low-Loss Acoustic Delay Lines," 8 pages, (at arXiv.org on Jan. 9, 2018).
Mahoney, A.C. et al., "On-Chip Microwave Quantum Hall Circulator," Physical Review X 7, pp. 011007-1-011007-9, 2017.
Manzaneque, T., Lu, R., & Gong, S., "An SH0 Lithium Niobate Dispersive Delay Line for Chirp Compression," Micro Electro Mechanical Systems (MEMS), IEEE 29th International Conference, Las Vegas, Nevada, USA, pp. 155-158, Jan. 22-26, 2017.
Qin, S., & Wang, Y.E, "A Nonreciprocal, Frequency-Tunable Notch Amplifier Based on Distributedly Modulated Capacitors (DMC)," IEEE MTT-S International Microwave Symposium Digest 2016, 3 pages, Aug. 2016.
Qin, S., Xu, Q., & Wang, Y.E, "Nonreciprocal Components with Distributedly Modulated Capacitors," IEEE Transactions Microwave Theory and Techniques vol. 62, No. 10, pp. 2260-2272, Oct. 2014.
Queck, C.K. & Davis, L.E., "Broad-Band Three-Port and Four-Port Stripline Ferrite Coupled line Circulators," IEEE Transactions on Microwave Theory and Techniques, vol. 52, No. 2 pp. 625-632, Feb. 2004.
Reiskarimian, N. & Krishnaswamy, H., "Magnetic-Free Non-Reciprocity Based on Staggered Commutation," Nature Communication, 7:11217, DOI: 10.1038.ncomms11217, pp. 1-10, published Apr. 15, 2016.
Shen, Q., & Barker, N.S., Distributed MEMS Tunable Matching Network Using Minimal-Contact RFMEMS Varactors, IEEE Transactions on Microwave Theory and Techniques, vol. 54, No. 6 pp. 2646-2658, Jun. 6, 2006.
Wang, Y.E., "Non-Reciprocity with Time-Varying Transmission Lines (TVTLs)," 2012 IEEE International Conference on Wireless Information Technology and Sytems (ICWITS), Maui, HI, pp. 1-4, 2012.
Zhou, Jo. Chuang, T.H., Dinc, T., & Krishnaswamy, H., "Integrated Wideband Self-Interference Cancellation in the RF Domain for FDD and Full-Duplex Wireless," IEEE Journal of Solid-State Circuits vol. 50, No. 12, pp. 3015-3031, Dec. 2015.
Zhu, J., Krishnaswamy, H., & Kinget, P.R., "Field-Programmable LNAs with Interferer-Reflecting Loop for Input Linearity Enhancement," IEEE Journal of Solid-State Circuits, vol. 50, No. 2, pp. 556-572, Feb. 2015.

(56) References Cited

OTHER PUBLICATIONS

Zhu, R. & Wang, Y.E, "Tunable RF Bandpass Filter for Interference Suppression in Software Defined Radios," IEEE International Microwave Symposium Digest pp. 2049-2051, doi:10.1109/MWSYM.2017.8059073, 2017.

* cited by examiner

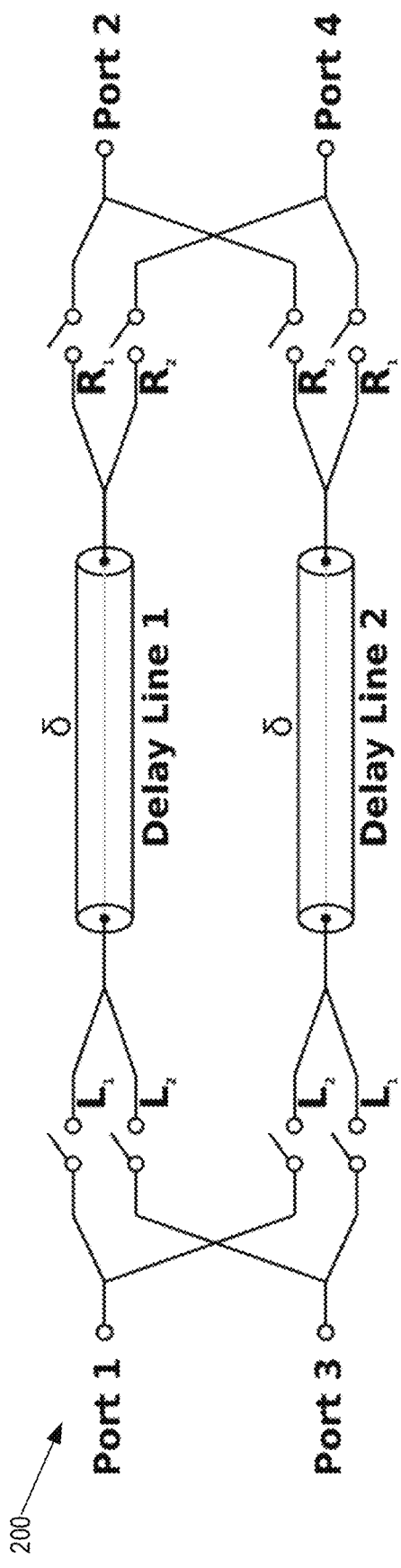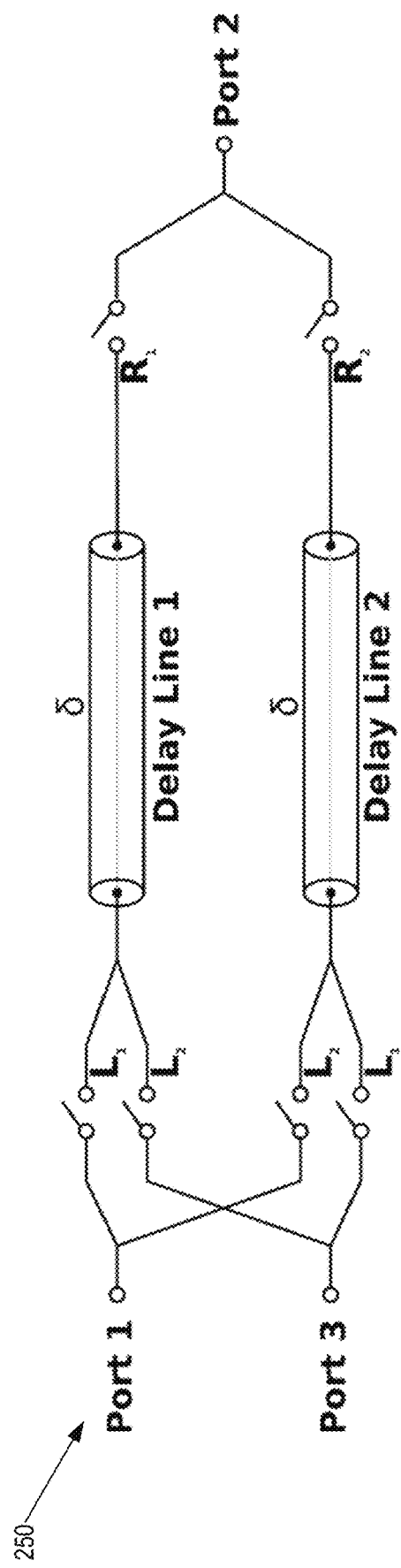
FIG. 2A
FIG. 2B

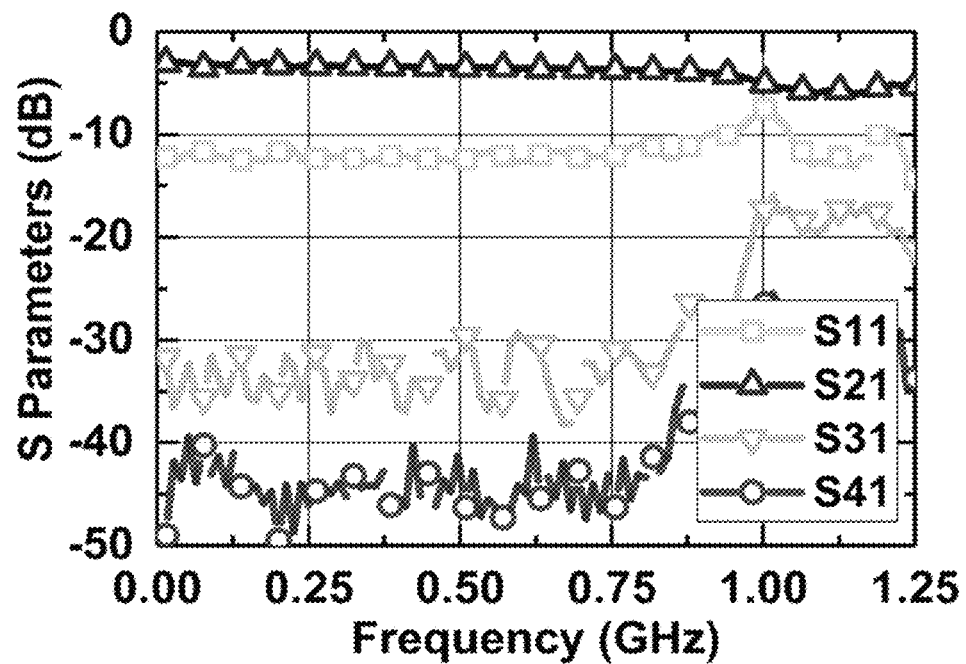
FIG. 3C
FIG. 4A   FIG. 4B
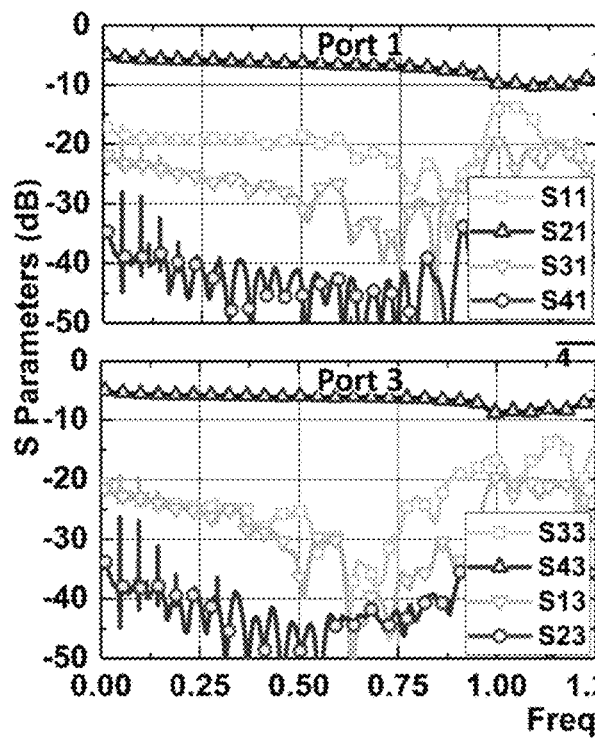
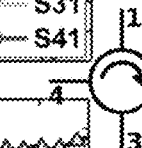
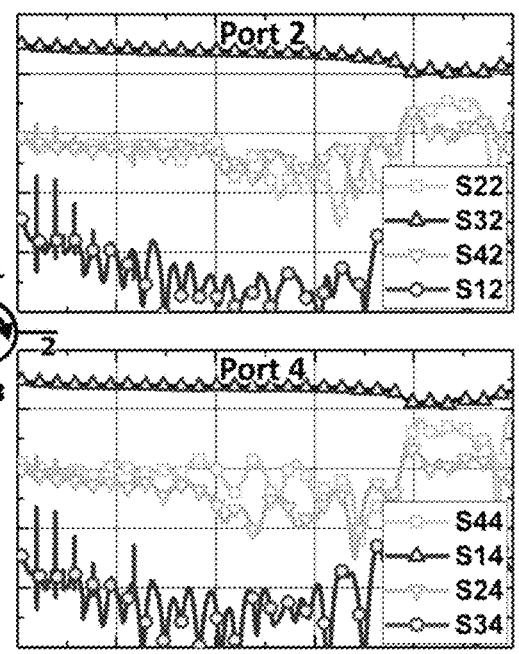
FIG. 4C   FIG. 4D

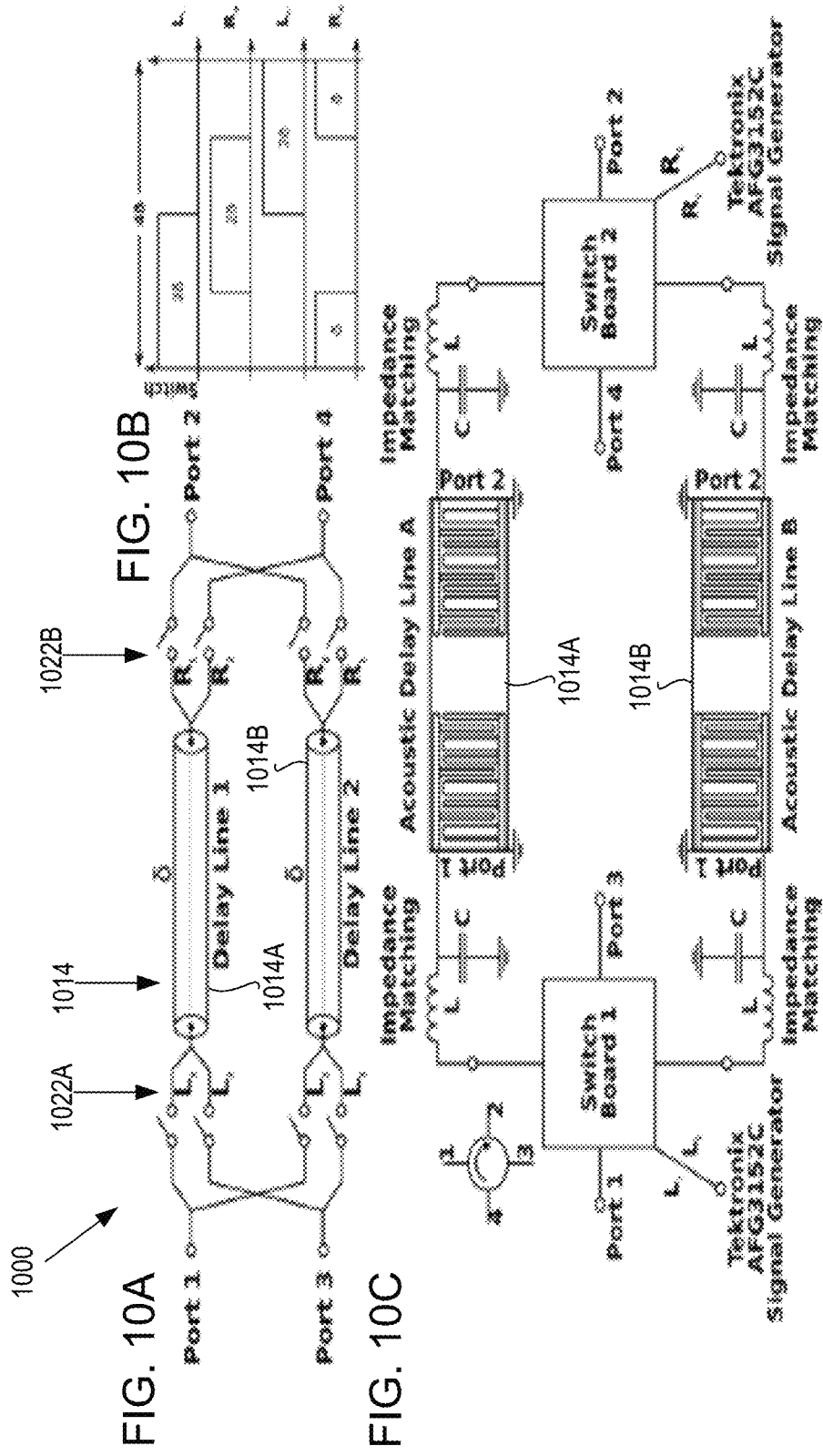

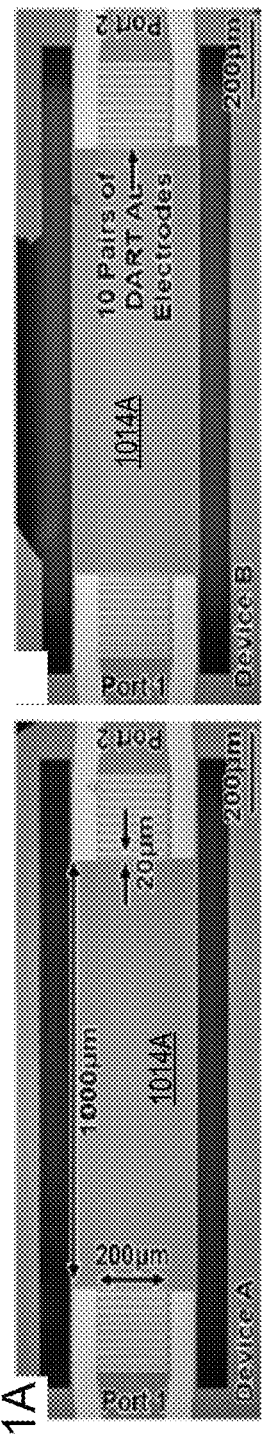
FIG. 11A
FIG. 11B
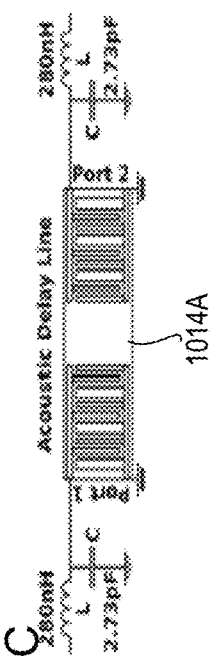
FIG. 11C
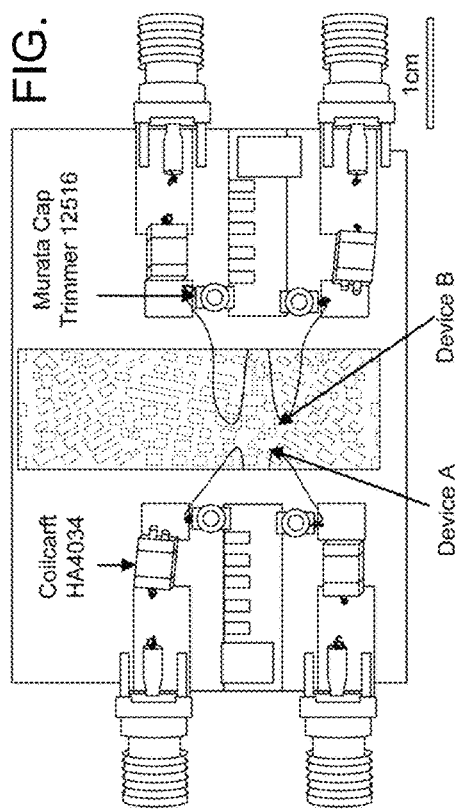
FIG. 11D

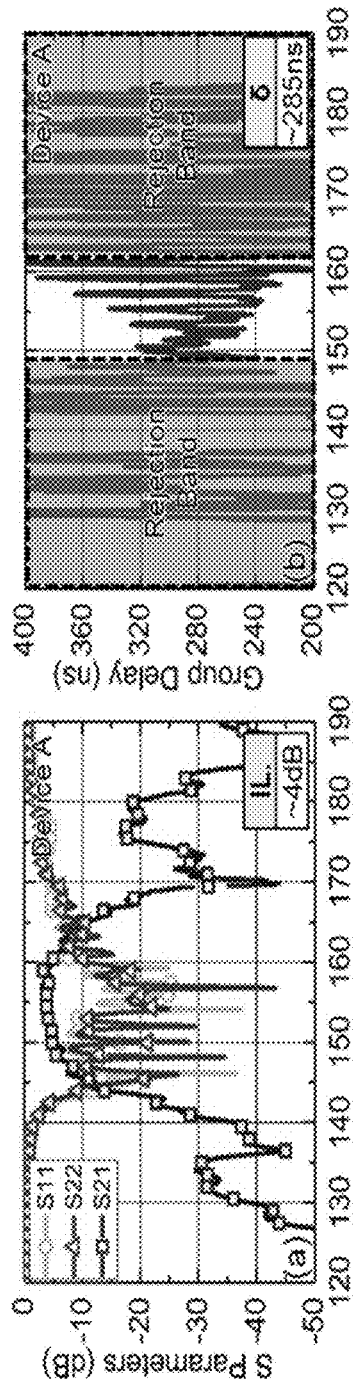
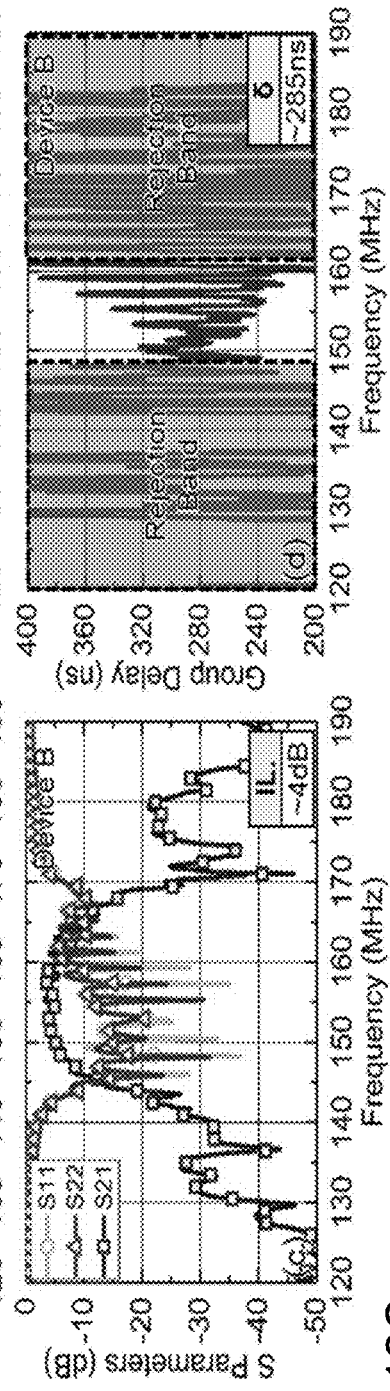
FIG. 12A  FIG. 12B  FIG. 12C  FIG. 12D

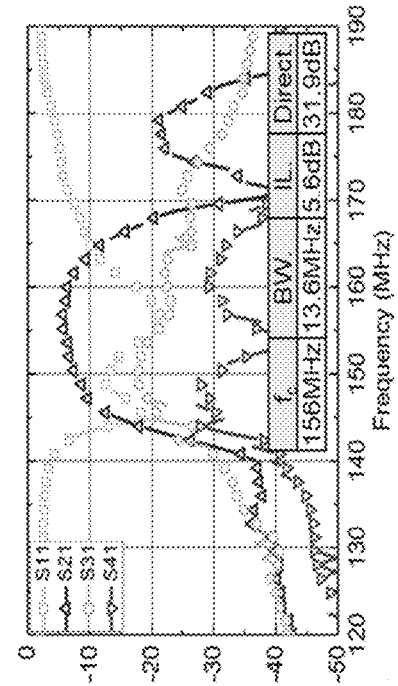
FIG. 13A
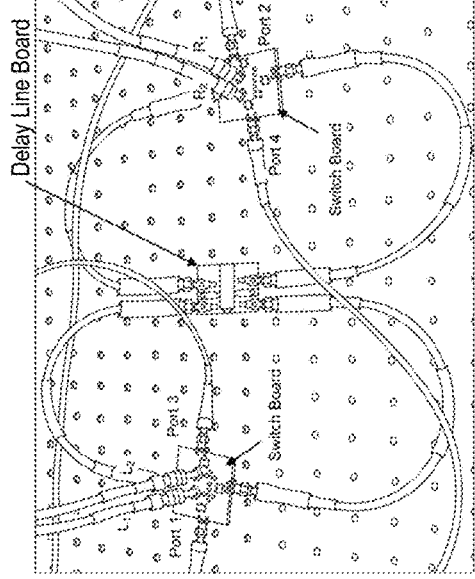
FIG. 13B
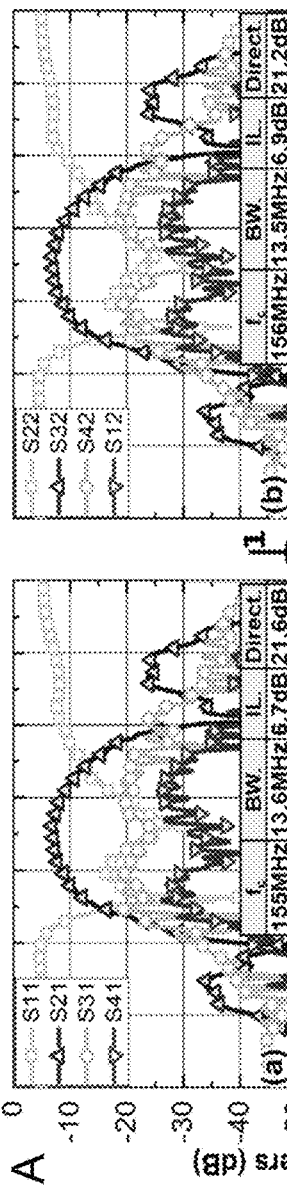
FIG. 14A
FIG. 14B
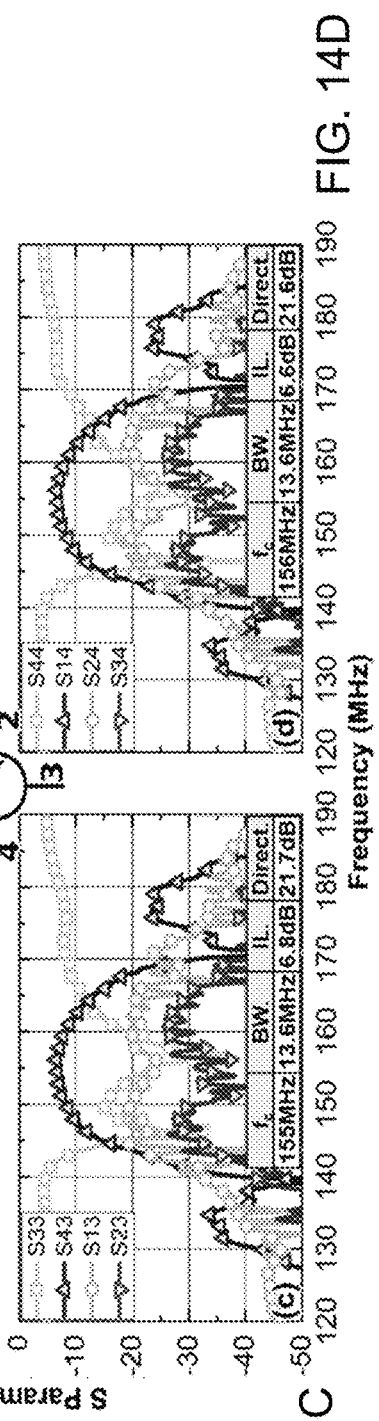
FIG. 14C
FIG. 14D

FREQUENCY INDEPENDENCE FOR SYNTHESIS WITHIN PROGRAMMABLE NON-RECIPROCAL NETWORK CIRCUIT

REFERENCE TO EARLIER FILED APPLICATION

This Application is a continuation of U.S. patent application Ser. No. 16/396,024, filed Apr. 26, 2019, which claims the benefit of U.S. Provisional Patent Application No. 62/663,523, filed Apr. 27, 2018, both of which are incorporated herein, in their entireties, by this reference.

FEDERALLY SPONSORED RESEARCH OR DEVELOPMENT

This disclosure was made with government support under HR-0011-17-2-0004 awarded, in conjunction with the Signal Processing at Radio Frequency (SPAR) program, by the Defense Advanced Research Projects Agency's (DARPA's) Micro-Systems Technology Office. The government has certain rights in the invention.

BACKGROUND

Microwave frequency nonreciprocal network circuits that bear non-reciprocal response have long been sought after for a wide range of applications, including full-duplexing radios and quantum computing. Most commonly utilized nonreciprocal multiport network circuits are isolators and circulators. Conventionally, nonreciprocity is obtained by magnetically biasing a ferrite material in which the electromagnetic wave propagates at different phase velocities in the opposite directions. In a circular structure based on a material of such properties, constructive and destructive interference of the clockwise and counter-clock wise propagating waves can exist at different nodes around the circular resonator, thus establishing transmission and isolation through ports situated at these nodes.

Motivated by attaining non-reciprocity for more integrated RF and microwave applications, temporal modulations, applied to either reactive or conductive elements, have recently been explored to produce a momentum-biasing equivalent to the magnetic ones and break the reciprocity. These approaches all rely on wave interference or mode splitting caused by biasing in a resonant structure. In other words, the bandwidth over which desirable non-reciprocal performance can be maintained are sensitive to phase delays between adjacent ports of the network circuit. Although wide-band phase nonreciprocal gyrators can be engineered to enhance the bandwidth of such network circuits, these type of non-reciprocal devices are inherently frequency dependent. Moreover, demonstrations on temporally modulated nonreciprocal devices so far are primarily two port gyrators and three port circulators.

Conceivably, both magnetic and temporal-modulation-based approaches can be expanded to a network circuit with more ports by exploiting established circuit topologies or simply networking several three-port circulators. However, the possibilities of reconfiguring the non-reciprocity in these approaches are limited. For example, only a small subset of circulation sequences through all ports are accessible among all permutations, due to the limitations arising from topology and application of momentum biasing.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 2A is a schematic diagram of a four-port circulator version of the 2N-port, delay line-based non-reciprocal network circuit of FIG. 1C, according to various embodiments.

FIG. 2B is a schematic diagram of a three-port circulator version reduced from the four-port circulator of FIG. 2A, according to various embodiments.

FIG. 3C is a graph that illustrates simulated S-parameter values of the four-port circulator of FIG. 3A according to an embodiment.

FIGS. 4A, 4B, 4C, and 4D are graphs illustrating measured S-parameter performance of the four-port circulator of FIG. 3A according to an embodiment.

FIG. 10A is a schematic diagram illustrating a four-port circulator with two acoustic delay lines according to an embodiment.

FIG. 10B is a graph of switch control signals applied to the network circuit of FIG. 10A according to an embodiment.

FIG. 10C is a block diagram of the four-port circulator of FIG. 10A with switching modules, impedance matching circuits, and unidirectional acoustic delay lines, according to an embodiment.

FIGS. 11A and 11B are images of a pair of fabricated acoustic delay lines with single-phase unidirectional transducers (SPUDT).

FIG. 11C is a diagram of inductor-capacitor (LC) circuits used to match impedance to 50Ω to reduce insertion loss according to embodiments.

FIG. 11D is an image of FR-4 board on which the delay lines (FIGS. 11A and 11B) and the matching networks (FIG. 11C) are disposed according to an embodiment.

FIGS. 12A, 12B, 12C, and 12D are graphs to illustrate measured (solid) and simulate (dashed) S-parameters and group delay of the impedance-matched delay line A, respectively 12A-12B, and of the impedance-matched delay line B, respectively 12C-12D, according to embodiments.

FIG. 13A is an image of an experimental setup of a four-port circulator, including two switch boards and a delay line board, according to one embodiment.

FIG. 13B is a graph that illustrates S-parameters obtained from the Advanced Design System (ADS) in simulation according to an embodiment.

FIGS. 14A, 14B, 14C, and 14D are graphs illustrating measured S-parameter performance of the four-port circulator as simulated in FIG. 13B, respectively: when port is excited (14A), port two is excited (14B), port three is excited (14C), and port four is excited (14D), according to various embodiments.

DETAILED DESCRIPTION

Figure 1A:
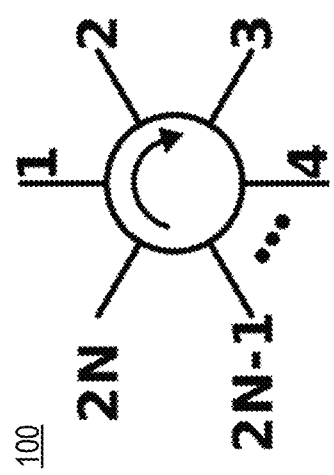
FIG. 1A is a schematic diagram illustrating the symbol of a 2N port within a clockwise circulator, according to one embodiment.

By way of introduction, the present disclosure provides a framework for synthesizing a frequency independent and broadly programmable nonreciprocal network circuit with an arbitrary number of ports (2N) using switches and an array of dispersionless delay lines (N), with N ports on each ends of the delay lines. The generalized 2N-port framework can also be reduced to a four-port, three-port, or two-port device with more compact size and less switched delay lines than the sequentially switched delay lines. This concept attains multi-port non-reciprocity by equally multiplexing, via a set of input ports, the input signal onto N delay lines in the time domain and later aggregating the delayed signals off the N delay lines consecutively at a set of output ports that are opposite to the set of input ports, e.g., an opposite port. The timing offset between switches addressed to each port results in each port being connected to only one delay line at any given time.

In various embodiments, a non-reciprocal apparatus may include a plurality of delay lines arranged in parallel, wherein each delay line of the plurality of delay lines exhibits a delay to input signals. In one embodiment, these delays are identical to each other. The apparatus may further include a first set of switches for each port of a first set of ports, where each switch of the first set of switches is to selectively couple a port of the first set of ports to first ends of the plurality of delay lines. The apparatus may further include a second set of switches for each port of a second set of ports, where each switch of the second set of switches is to selectively couple a port of the second set of ports to second ends of the plurality of delay lines. In one embodiment, any of the first set of ports is to receive an input signal and any of the second set of ports is to output a delayed version that input signal. In additional, or alternative, embodiments, any of the second set of ports is to receive an input signal and any of the first set of ports is to output a delayed version of that input signal. These embodiments may be combined.

In the embodiments, the signal source is coupled to control ports on the first set of switches and the second set of switches. The signal source is to generate a series of clock signals, of which each on period lasts twice the delay, which are sequentially time delayed between the first set of switches and the second set of switches, such that an input signal at one of the first or second sets of ports travels from the one of the first or second sets of ports to an opposite set of ports over the delay lines, and is output at an output port of the opposite set of ports.

In another embodiment, the signal source generates: i) a first set of clock signals that are applied to the first set of switches such that only one switch of the first set of switches for each port is activated at a time; and ii) a second set of clock signals that are applied to the second set of switches for each port. The first set of clock signals and the second set of clock signals may ensure that only one switch of the each of the first set and the second set of switches is activated at a time for any given port, to deliver the input signal sequentially between one of the first set of ports and one of the second set of ports or between one of the second set of ports and one of the first set of ports. The input signal, which is delayed by the delay on each crossing of a delay line, is output non-reciprocally with reference to the input signal received at one of the first set or the second set of ports. In various embodiments, the input signals applied to various input ports (of either of the first or second sets of input ports) may be time multiplexed of a single input signal or may come from feeds of separate input signals. In one embodiment, the first set of clock signals is generated by a first switching control signal generator and the second set of clock signals is generated by a second switching control signal generator.

Unlike the above-mentioned momentum biasing approaches, the non-reciprocal performance of the disclosed network circuit may only depend on the time delays, instead of phase delays, and therefore be frequency independent. Furthermore, the network circuit has many more programmable states than any alternative reconfigurable non-reciprocity, e.g., via timing of non-reciprocity between any first port of the first set of ports and any second port of the second set of ports and/or between any first port of the second set of ports and any second port of the first set of ports. Such programmability of nonreciprocity in a multi-port network will inspire new applications in multiple input multiple output (MIMO) communication systems.

As discussed, the frequency independent performance of non-reciprocity is the outcome of synchronization of time-domain multiplexing and delays between ports in the forward path, and based on synchronization between the ports in the backward route (e.g., ports in paths that would produce reciprocity, if allowed, and thus be against the direction of circulation in the device). A number of causes in practice can compromise the frequency independent performance and yield a broadband performance instead. For instance, electromagnetic delay lines between ports typically exhibit dispersion, which causes the synchronization between switching and delay to degrade as the operating frequency moves off the design center frequency. To reduce size, delay lines based on slow-wave or meandering structures often have a cut-off frequency that also limits the bandwidth (BW) of the nonreciprocal network. Other types of delay lines with smaller sizes, e.g., acoustic delay lines, usually have passbands over which low insertion loss and constant group delay can be maintained. Nonetheless, with the disclosed frequency independent framework as the basis, the BW over which non-reciprocity is enabled may be limited in practical scenarios by the components chosen for implementation. For example, different types of switches and delay lines may impact differently the BW over which non-reciprocity is enabled.

In embodiments, the frequency independent performance is not dependent on the temporal effort applied in the system. Unlike the momentum-biasing approaches where the bandwidth of nonreciprocity is fundamentally limited by the modulation frequency used to produce momentum biasing, the switching frequency in the disclosed framework may be set by the time delay length imposed by the delay lines. Provided with low loss delay lines to render long group delays, the switching frequency can be reduced to a mere fraction of the non-reciprocal bandwidth (e.g., 23.8 MHz switching frequency for maintaining a non-reciprocal bandwidth of 900 MHz in one example), consequently giving rise to simpler and lower cost clock generation, less phase delay in clock signal fan-out, and minimized overall temporal effort.

Network expandability without compromising performance and symmetry expanding a momentum-biased three-port circulator into an N-port circulator is a non-trivial task. Simply adding more folds of symmetry in the structure will not produce unilateral circulation. In other words, the excitation at one port will be non-reciprocally received at more than one port. A typical way to attain nonreciprocal networks with more ports using momentum-biased devices is to network three-port circulators in various manners, such as the method reported for creating macroscale topological materials. See Fleury, R., Khanikaev, A. B. & Alù, A, "Floquet topological insulators for sound," *Nat. Commun.* 7, 11744 (2016). With each added circulator in the network circuit, the number of ports in the network circuit can be maximally increased by one, thus suggesting a heavy cost in component counts and clock feeds for constructing multi-port nonreciprocal network circuits beyond three ports. Additionally, networking three-port circulators often breaks the network structural symmetry and creates unbalanced paths between ports. Consequently, higher insertion loss is expected for paths that require the signal to traverse farther in the composed multi-port network circuit to reach destination ports.

For the even-port operation in our time-multiplexed framework, one can add two more ports to the network circuit with each added delay line, which compares favorably against the network expansion via interconnecting three-port circulators. For network circuits with an odd number of ports, the cost of expansion is the same, except for adding the last port, which requires a delay line for its own. Advantageously in the disclosed framework, the transmission paths are balanced with the same insertion loss and delay regardless of the number of ports. Thus, the disclosed 2N-network circuit maintains N folds of symmetry in both the structural design and performance.

FIG. 1A is a schematic diagram illustrating the symbol of a 2N port within a clockwise circulator 100, according to one embodiment. Note the ports are numbered from one ("1") to 2N. Generating non-reciprocity between these 2N ports is a challenge for the reasons discussed. In different embodiments, the 2N-port, clockwise circulator 100 may be made to be counter-clockwise by numbering the ports in the opposite direction.

Figure 1B:
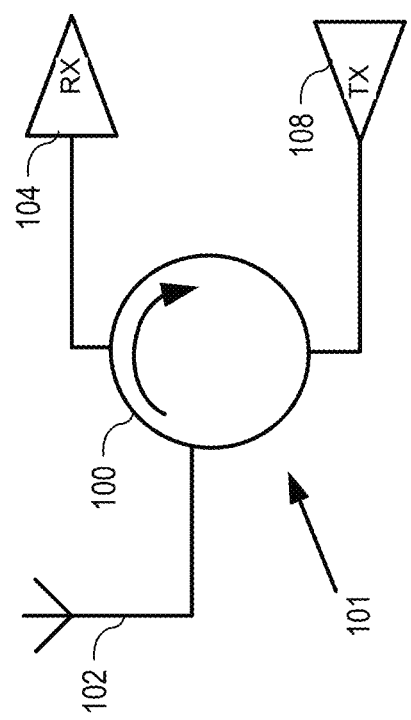
FIG. 1B is a schematic diagram illustrating the 2N-port, clockwise circulator within a radio frequency (RF) transceiver according to an embodiment.

FIG. 1B is a schematic diagram illustrating the 2N-port, clockwise circulator 100 within a radio frequency (RF) transceiver 101 according to an embodiment. The RF transceiver 101 may include the 2N-port, clockwise circulator 100 coupled to an antenna 102, to a receiver 104, and to a transmitter 108.

Figure 1C:
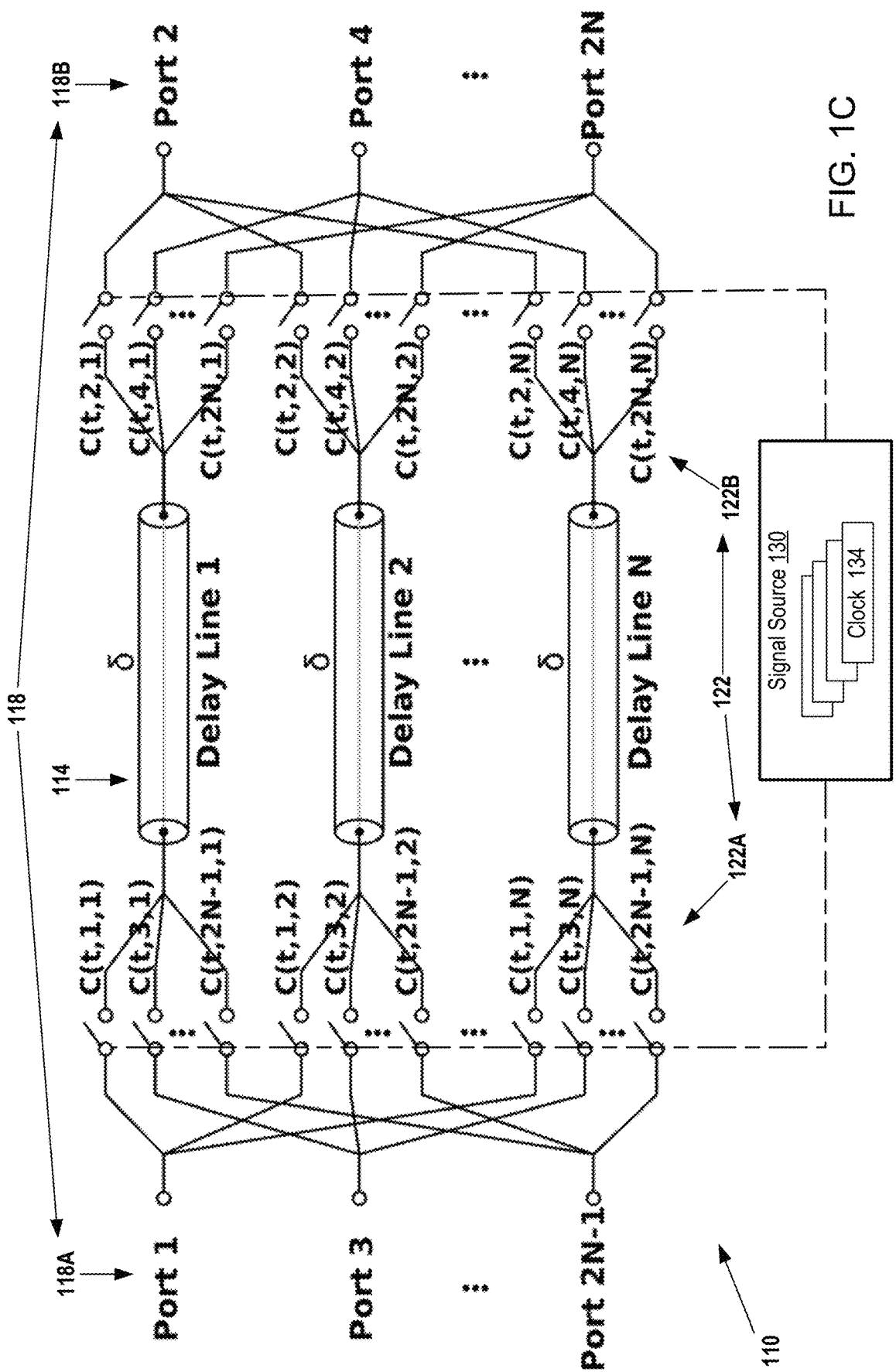
FIG. 1C is a schematic diagram illustrating a 2N-port, delay line-based non-reciprocal network circuit according to an embodiment.

FIG. 1C is a schematic diagram illustrating a 2N-port, delay line-based non-reciprocal network circuit 110, or the "disclosed network circuit 110," according to an embodiment. The disclosed network circuit 110 may include multiple delay lines 114 coupled between multiple ports 118, to include at least four identical delay lines. The multiple ports 118 may include a first set of ports 118A coupled to first ends of the delay lines 114 and a second set of ports 118B coupled to second ends of the delay lines 114. The delay of each delay line may be an identical delay ($\delta$) to provide proper synchronization of an input signal with a delayed input signal that is output at an opposite end of a delay line.

The disclosed network circuit 110 may further include multiple switches 122 interposed between the multiple ports 118 and the multiple delay lines 114 to provide synchronized switching between the multiple ports 118 and the multiple delay lines 114, e.g., so that each port is connected to only one delay line at any given time and that each input signal received at one port is properly absorbed at an output port. The multiple switches 122 may include a first set of switches 122A for each port of the first set of ports 118A, where each switch of the first set of switches 122A is to selectively couple a port of the first set of ports 118A to first ends of the delay lines 114. One or more of the first set of ports 118A are to receive input signal(s) or output signal(s) depending on switch timing. The multiple switches 122 may further include a second set of switches 122B for each port of the second set of ports 118B, where each switch of the second set of switches 122B is to selectively couple a port of the second set of ports 118B to second ends of the delay lines 114. One or more of the second set of ports 118B are to receive input signal(s) or output signal(s) depending on switch timing.

For example, an input signal may be applied to one of the first set of ports 118A and the delayed input signal may be output from one of the second set of ports 118B. Similarly, a second input signal (or a time-delayed portion of the same input signal) may be applied to one of the second set of ports 118B and the delayed version of the second input signal may be output from one of the first set of ports 118A. More than one port may be excited at a time, and timing control of the switches enables coordinating an output port for each input signal.

Figure 1D:
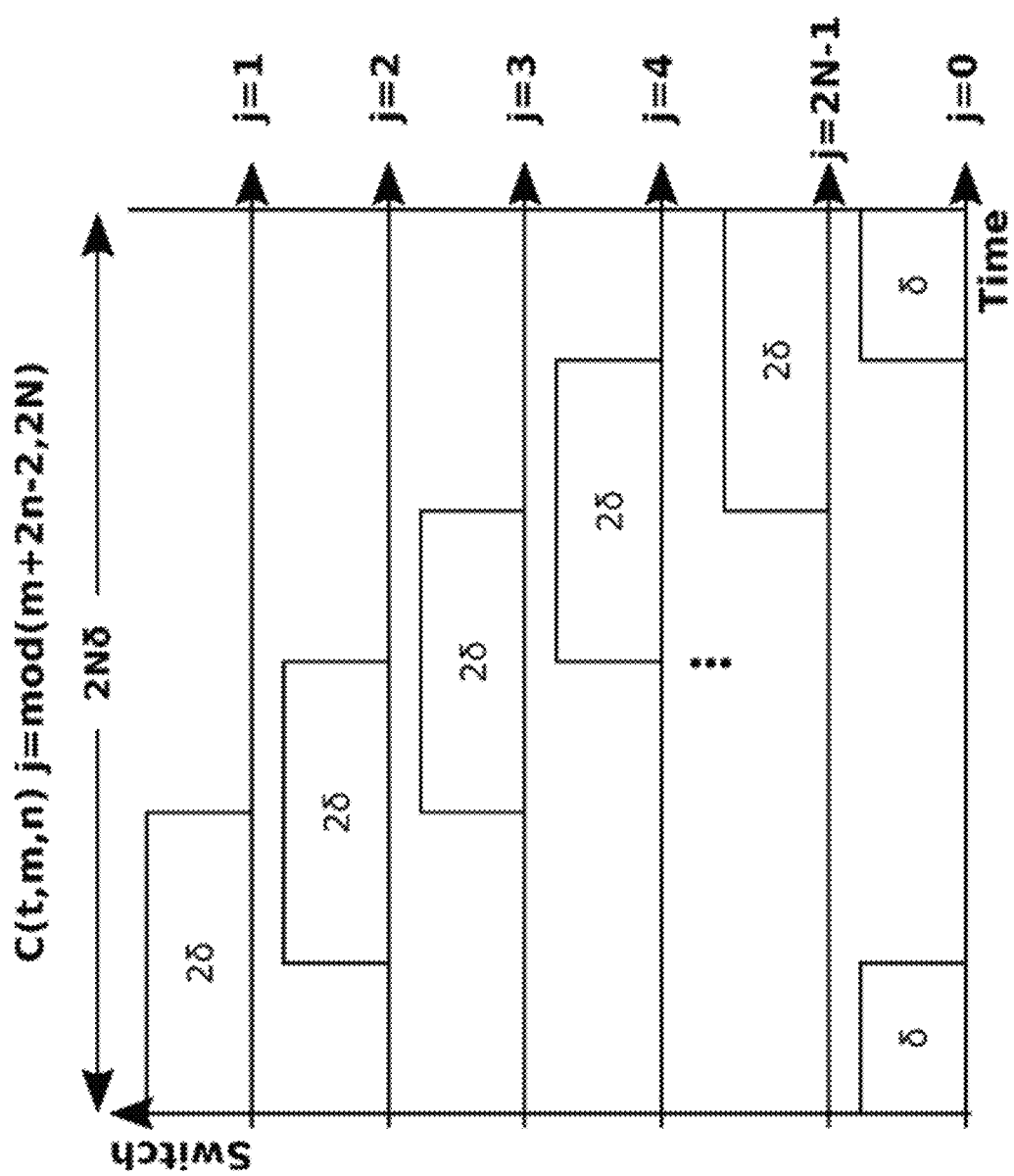
FIG. 1D is a graph that illustrates switch control signals applied to switches of the non-reciprocal network circuit of FIG. 1C.

In various embodiments, disclosed network circuit 110 further includes at least one signal source 130, which may include multiple clocks 134, coupled to control ports of each of the first set of switches 122A and the second set of switches 122B, e.g., for respective ports of the first and second sets of ports 118A and 118B. The signal source 130 may be one or more switching control signal generator (e.g., "signal generator" for simplicity) or other sources of control waveform signals. For example, FIG. 1D is a graph that illustrates switch control signals, which may be generated by the multiple clocks 134 and applied to sequentially-numbered switches of the first and second sets of switches 122A and 122B of the non-reciprocal network circuit of FIG. 1C, to generate non-reciprocity within the disclosed network circuit 110. Note that the switch control signals are sequentially sent back and forth between the first set and the second set of switches 122A and 122B, thus causing an input signal at port 1 to output at port 2 over the first delay line, causing a second input signal at port 2 over the second delay line to output at port 3, causing a third input signal at port 3 over the third delay line to output at port 4, and so forth. In one embodiment, the first, second, and third input signals are time-multiplexed off the same input signal feed. In an alternative embodiment, the first, second, and third input signals are from separate input signal feeds.

For example, in one embodiment, the signal source 130 generates a series of clock signals (of which FIG. 1D is but one example), of which each on period lasts twice the delay of the multiple delay lines 114, which are sequentially time delayed between the first set of switches and the second set of switches (and vice versa), such that an input signal at one of the first set of ports 118A is output at an output port of one the second set of ports 118B (or that an input signal at one of the second set of ports 118B is output at an output port of one of the first set of ports 118A).

More specifically, the series of clock signals may sequentially: i) turn on a first switch of the first set of switches of a first port of the first set of ports 118A to pass a first input signal from the first port of the first set of ports 118A across a first delay line of the multiple delay lines 114; ii) turn on a first switch of the second set of switches 122B of a first port of the second set of ports 118B to output the first input signal at the first port of the second set of ports 118B; iii) turn on a second switch of the second set of switches 122B of the first port of the second set of ports 118B to pass a second input signal from the first port of the second set of ports 118B to a second delay line of the multiple lines 114; iv) turn on a second switch of the first set of switches 122A of a second port of the first set of ports 118A to output the second input signal at the second port of the first set of ports 118A; v) turn on a third switch of the first set of switches 122A of a second port of the first set of ports 118A to pass a third input signal from the second port of the first set of ports 118A to a third delay line of the plurality of delay lines 114; vi) and turn on a third switch of the second set of switches 122B of a second port of the second set of ports to output the third input signal at a second port of the second set of ports 118B. In one embodiment, the first input signal, the second input signal, and third input signal come from separate input feeds, e.g., in the case of MIMO. In another embodiment, the first input signal, the second input signal, and third input signal are time-multiplexed portions of an identical input signal.

If the-above described embodiment of FIG. 1C were a 2N-port circulator, then the series of clock signals may further sequentially turn on the first switch of each of the first set of switches 122A, C(t,1,1) to C(t,1,N), to circulate a last input signal from a last port (2N) of the second set of ports to the first port (Port 1) of the first set of ports. In this way, the circulation of input signals may continue through the delay lines of a 2N-port circulator.

In another embodiment, the signal source 130 may include at least two clocks to generate: a first set of the series of clock signals, which are applied to the first set of switches such that only one switch of the first set of switches is activated at a time; and a second set of the series of clock signals, which are applied to the second set of switches such that an input signal that excites one of the first or second sets of ports 118A and 118B travels from the one of the first or second sets of ports 118A and 118B to an opposite set of ports over the multiple delay lines, and is output at an output port of the opposite set of ports. The delayed input signal may therefore be output non-reciprocally with reference to the input signal received at the first set of ports (or with reference to the input signal received at the second set of ports in a counter-clockwise circulator).

Accordingly, on either side of the delay lines 114, each port may be fanned out to be selectively coupled to any of the delay lines 114 through the multiple switches 122. The multiple switches 122 may each be a single pole single throw (SPST) switch that presents open in the off state. Therefore, composition of the 2N-port, non-reciprocal network circuit 110 may employ N delay lines and 2N2 SPSTs (or 2N single pole N throws (SPNTs)) in various embodiments.

The clock signal for controlling each switch may be denoted as C(t,m,n), where t represents time, m represents a sequential port number of the first set of ports 118A, n represents a sequential delay line number of the multiple delay lines 114. All the clocks have a period of two times a number of the plurality of delay lines times the first delay (2Nδ), and a duty cycle of 1/N. Within the time range [0, 2Nδ], the control signal may be represented as:

$$C(t, m, n) = \begin{cases} H[t - (j-1)\delta] - H[t - (j+1)\delta] & \text{for } j \neq 0 \\ H[t] - H[t - \delta] + H[t - (2N-1)\delta] - H[t - 2N\delta] & \text{for } j = 0 \end{cases}$$

where H is the Heaviside step function, and j is the remainder of the modulo operation.

$$j = \mod(m + 2n - 2, 2N)$$

The signal source 130 may generate the first set of clock signals C(t,m,n) to turn on only one switch, among the first set of switches 122A coupled to Port m (at the first ends of the delay lines 114) at any given time so that the input signal is sequentially time-multiplexed onto the N delay lines. The ports identified as Port m may be odd numbers, e.g., 1, 3, ... 2N−1. At the second ends of delay lines 114 coupled to Port m+1, the signal source 130 may generate clock signals C(t,m+1,n) onto the second set of switches 122B that are designed to be a time delayed version of C(t,m,n), with a timing offset of δ, the identical delay. In this way, the input signal, after traversing N delay lines 114, is collected and de-multiplexed into Port m+1, which is the output of the non-reciprocal apparatus component. The value m+1 represents a sequential port number of the second set of ports 118B, and may be identified as even numbers, e.g., 2, 4, . . . 2N.

In the reverse path, delayed input signals fed into Port m+1, after being time multiplexed onto and traversing the delay lines 114, are subsequently rejected by Port m because the switching control clocks, C(t,m,n), are the time advanced versions of C(t,m+1,n). In other words, the first set of switches 122A are turned off as the input signal arrives at Port m from Port m+1. On the other hand, the second set of switches 122B coupled to Port m+2 are synchronized with the arrival of delayed input signals from Port m+1 to aggregate them as output from the delay lines 114, and so forth through additional ports of the second set of ports 118B. The exception exists for Port 2N, to which the input signals are to be circulated back to Port 1.

For the 2N-port, non-reciprocal network circuit 110 that includes infinitely fast and lossless switches, lossless dispersionless delay lines, and is addressed by ideal square control waveform signals, infinitely large isolation, zero insertion loss, and zero return loss in the circulation are predicted. The perfectly-synchronized time-domain multiplexing and de-multiplexing on opposite ends of the N delay lines 114 allow input signals incident from Port m to exclusively transmit to corresponding Port m+1, while the energy leakage in the reverse order is completely cut off. In disclosed embodiments, N is to be an even number due to the symmetry of the network. For producing an odd number of ports, a network circuit with an even number of ports can be reduced to have one less port by leaving one port open, e.g., thus eliminating N SPSTs.

Figure 2C:
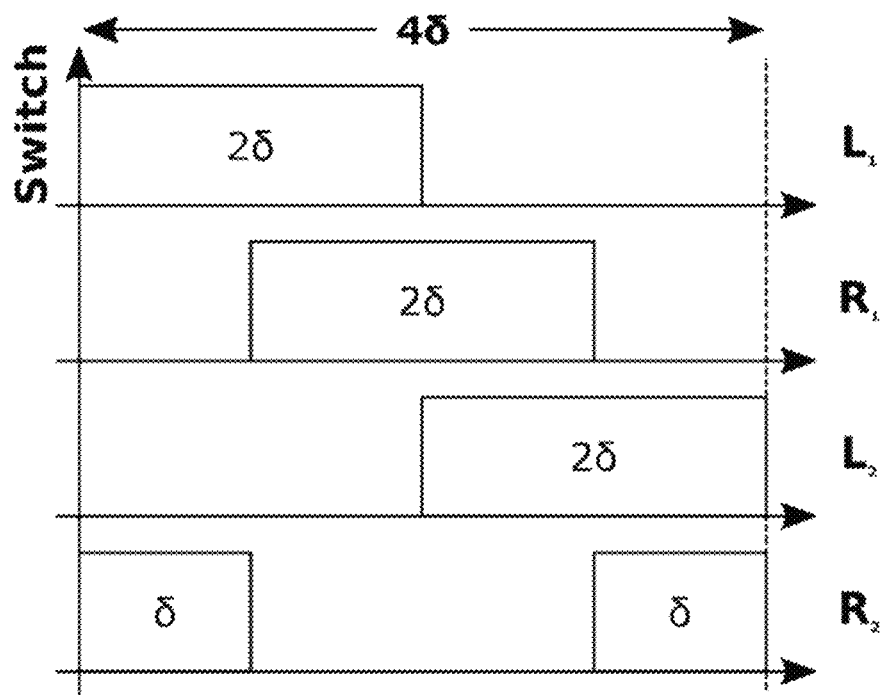
FIG. 2C is a graph that illustrates switch control signals applied to the four-port circulator of FIG. 2A for producing clock-wise (from port 1 to port 4) circulation according to an embodiment.

FIG. 2A is a schematic diagram of a four-port circulator 200 version of the 2N-port, delay line-based non-reciprocal network circuit of FIG. 1C, according to various embodiments. As an example seen in FIG. 2B, the four-port network circuit is reduced to a three-port circulator 250 that is typically sought after for full-duplex radio applications. To experimentally validate the framework of 2N-port, non-reciprocal network circuit 110, one may produce the four-port circulator 200 based on the 2N-port framework with a frequency span from direct current (DC) to 1 GHz bandwidth. FIG. 2C is a graph that illustrates switch control signals applied to switches of the four-port circulator 200 of FIG. 2A for producing clock-wise (from port 1 to port 4) circulation according to an embodiment.

Figure 3B:
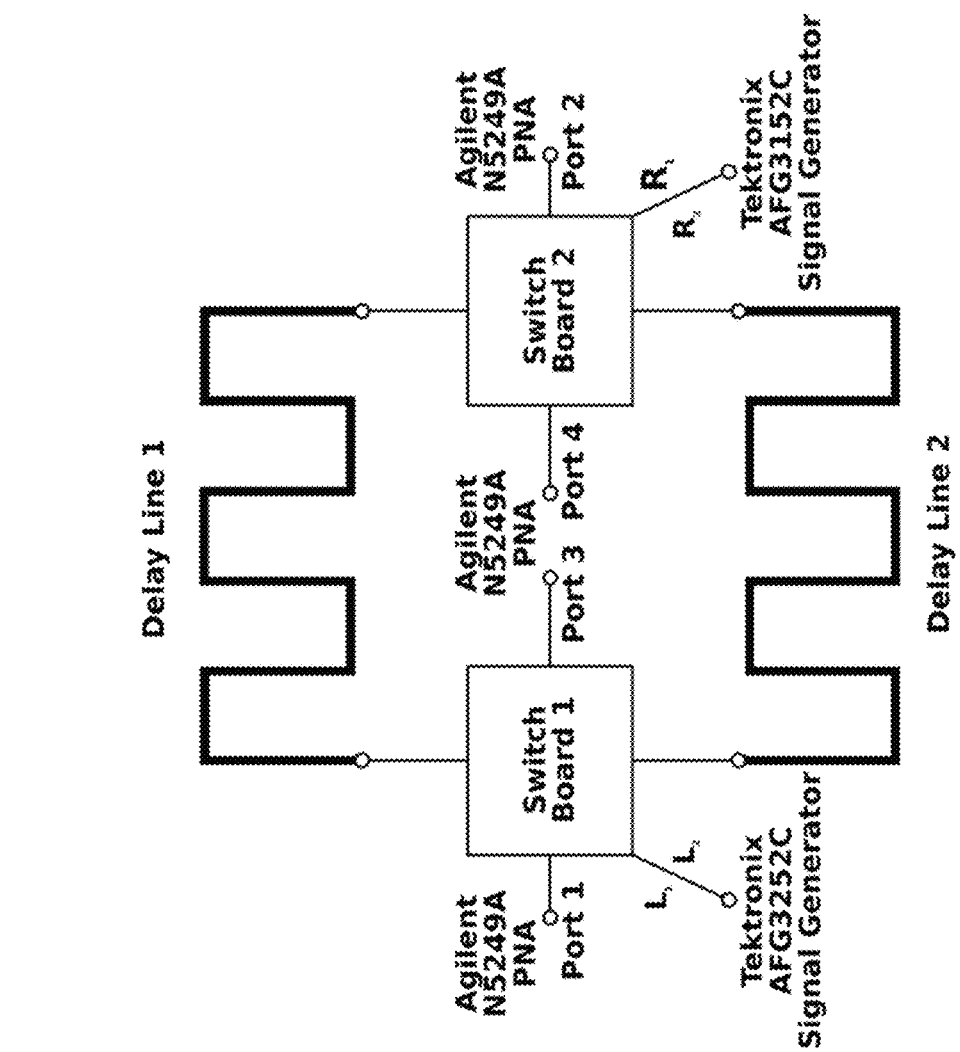
FIG. 3B is a schematic diagram illustrating switch control signals for producing clock circulation in the four-port circulator of FIG. 3A according to an embodiment.
Figure 3A:
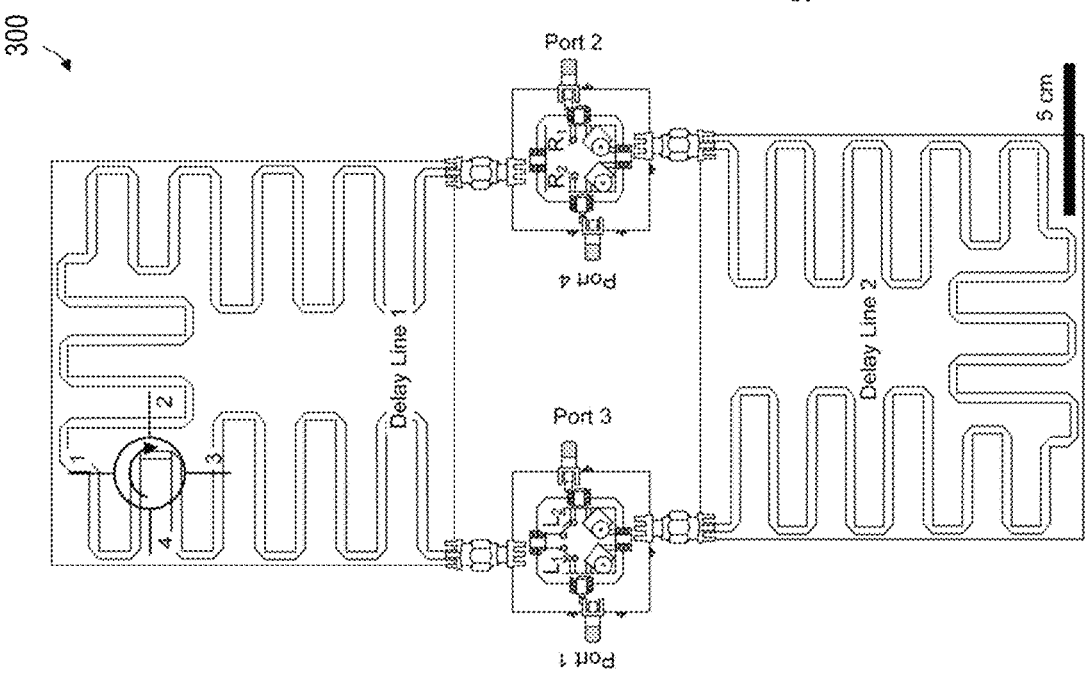
FIG. 3A is an image of a four-port circulator having two switching modules and two micro-strip delay lines according to an embodiment.

FIG. 3A is an image of a four-port circulator 300 having two switching modules and two micro-strip delay lines according to an embodiment. FIG. 3B is a schematic diagram illustrating switch control signals for producing clock circulation in the four-port circulator 300 of FIG. 3A according to an embodiment. As seen in FIG. 3A, the prototype is implemented with connectorized switching and delay line modules. Two delay line modules, with each end coupled to a switching module (e.g., switching board), form the non-reciprocal network circuit. One may take the modular approach for experimental validation, which allows more nodes to experimentally observe performance and analyze loss in the four-port network. The present design for a four-port switching module employed two single-pole-single-throw series (SPST) switches that present near open circuit to the input in the off-state. In practice, open-reflective switches are not commonly available with fast switching time. Alternatively, four short-reflective switches, Mini-circuit MSW 2-20+, are arranged in a lattice configuration (see FIG. 7A through FIG. 9B) to equivalently produce switching of two SPST open-reflective switches. The Mini-circuit MSW 2-20+ has a fast switching time of 2 ns, which minimizes the insertion loss due to switching. The delay line modules are implemented using Roger Duroid 6010.2LM boards with meandering microstrip structures to produce a total group delay of 10.5 ns with slight dispersion that is less than one ns.

In operation, the switches (on the switch boards) are controlled by four clock signals that each have a period of 42 nS and a frequency of 23.8 MHz. The slightly increased delay is caused by the additional electrical length in the control boards. The switches on the first ends of the delay line are complimentarily-driven while the switches on the second ends of the same delay line are driven with a timing offset of 10.5 nS. The clock signals are generated, for purposes of experimentation, by two synchronized dual-channel Tektronix arbitrary function generators and fed to the control ports on the switching modules.

Advanced Design System (ADS) is an electronic design automation software system produced by Keysight EEs of Electronic Design Automation (EDA), a division of Keysight Technologies™. ADS was employed for simulating performance of the four-port circulator 300. The switches have two ns switching time, an on-state resistance of 3Ω, and an off-state resistance of 60 kΩ. The delay lines are represented by their "Scattering" or S-parameter performance, which is modeled using ADS momentum. To extract the frequency domain response of the network circuit, a series of time domain simulations with varying single tone inputs to Port 1 are performed before Fourier transform is performed to attain scattered power out of other ports at the input frequency.

FIG. 3C is a graph that illustrates simulated S-parameter values of the four-port circulator 300 of FIG. 3A according to an embodiment. As seen in FIG. 3C, the simulation shows a broadband (up to 0.9 GHz) nonreciprocal performance. The S11 line represents how much reflection out of port 1 when port 1 is excited. Similarly, the S12 line illustrates how much transmission is observed out of port 2 when port 1 is excited, the S13 line—if excite port 1, how much transmission get out of port 3 illustrates how much transmission is observed out of port 3 when port 1 is excited, and the S14 line illustrates how much transmission is observed out of port 4 when port 1 is excited. An insertion loss of 3 dB at low frequencies is caused by the non-ideal switch properties and the loss in the delay lines. A significant isolation over 30 dB is simultaneously observed. The performance degrades at higher frequencies due to the additional loss in the delay lines. The non-reciprocal network of the four-port circulator 300 was tested with a four-port Keysight PNA-X network analyzer. Calibration was performed with Keysight 85052D calibration kit to move the measurement reference planes to the connectors on the switch modules. The four-port S-parameter is subsequently characterized with IF bandwidth of 1 kHz and a measurement power level of −5 dBm.

FIGS. 4A, 4B, 4C, and 4D are graphs illustrating measured S-parameter performance of the four-port circulator of FIG. 3A according to an embodiment. As seen in FIGS. 4A-4D, broadband non-reciprocal responses are obtained from 10 MHz to 0.9 GHz. A minimum insertion loss of 5.1 dB is obtained at low frequencies. Isolation of 35 dB is measured between the adjacent ports and 20 dB between the diagonal ports. As the frequency increases to the self-resonance in the delay lines around 0.9 GHz, the insertion loss and isolation performance gradually decay to 7.6 dB and 24 dB, respectively. The measured performance slightly deviates from the simulated results due to the simplification of switches in the model and multi-reflections on delay lines caused by impedance mismatch at ports.

Figures 5A, 5B:
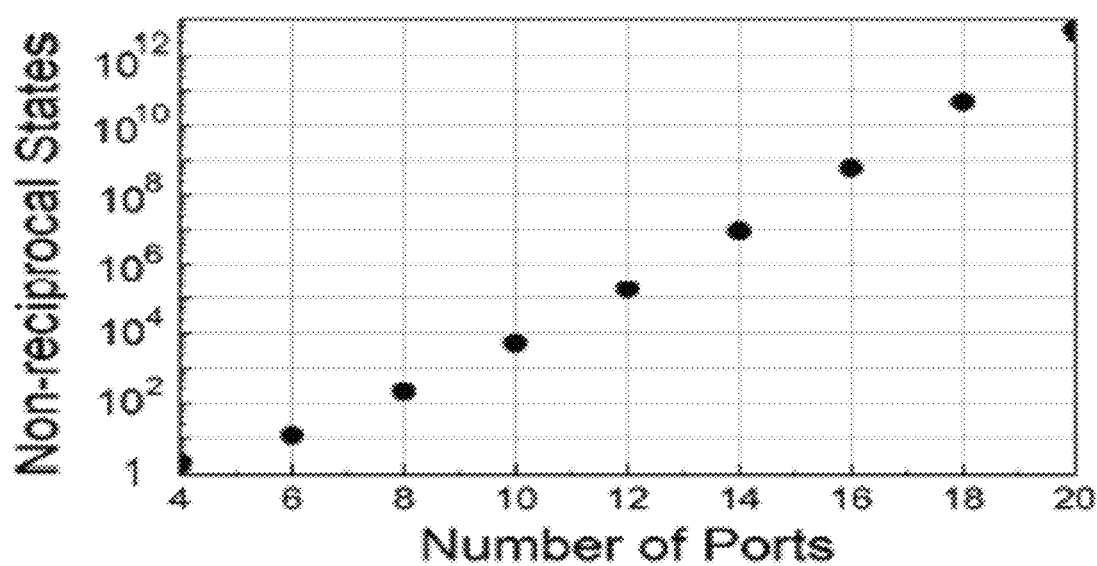
FIG. 5A is a graph illustrating an S-matrix corresponding to programmable excitation of delay lines of the 2N-port, delay line-based non-reciprocal network circuit of FIG. 1C according to various embodiments.
FIG. 5B is a graph illustrating the number of programmable states as a function of the number of ports deployed within the 2N-port, delay line-based non-reciprocal network circuit of FIG. 1C, according to various embodiments.

FIG. 5A is a graph illustrating a "scatter" or S-matrix corresponding to programmable excitation of delay lines of the 2N-port, delay line-based non-reciprocal network circuit 110 of FIG. 1C according to various embodiments. FIG. 5B is a graph illustrating the number of programmable states as a function of the number of ports deployed within the 2N-port, delay line-based non-reciprocal network circuit 110 of FIG. 1C, according to various embodiments. Enabling programmable RF circuits has been the ideal problem driving the design of highly adaptive RF systems in the past decade, focusing primarily on either passive reciprocal networks, such as filters, antenna tuners, and phase shifters, or active/non-reciprocal circuits, such as amplifiers. Programmability of passive non-reciprocity has rarely been visited even though the current carrier aggregated communication systems can greatly benefit from programmable non-reciprocity in front ends. Temporally modulated non-reciprocal systems have recently revived the hope for achieving such programmability without compromising other relevant performance specifications.

The disclosed network circuit 110 is readily programmable by first re-shuffling the sequences by which the clock waveform signals are applied to the first set of switches 122A at the first ends of the delay lines 114, and then adjusting the clock waveform signals applied to the second set of switches 122B at the second ends of the delay lines 114 accordingly. These clock waveform signals are control clock signals to activate (e.g., turn on) the switches to which the signals are sent. In other words, at least one clock signal of the first set of the series of clock signals is sequenced numerically out of order of m port number of the first set of ports, and a corresponding at least one clock signal of the second set of the series of clock signals is sequenced numerically out of order of m+1 port number of the second set of ports. Through this type of programming, any port on first ends of the delay lines 114 can be configured to circulate to any port on the second ends of the delay lines 114, thus allowing for a rich space of non-reciprocal states. In other embodiments, the direction of circulation may be changed by controlling the sequence of switching between the first set of switches 122A and the second set of switches 122B, and vice versa.

In embodiments, the accessible states for the 2N-port non-reciprocal network can be studied as S-matrix permutations with the only limitation that circulation between ports on the same side of the delay lines 114 is not possible. Therefore, assuming all ports are matched, the components in the shaded regions of the S-matrix of FIG. 5A are inaccessible for programming. On the other hand, assuming the non-reciprocal network circuit is lossless and S-matrix is unitary, the sub-matrices outlined by the dotted boxes in have a single complex component in each row and column. Provided that the implementation is balanced with identical switches on both ends of the identical delay lines 114, these complex components are identical with a magnitude of one ("1"), and are each denoted as α. Note that the programming of the network, which may be reflected in the S-matrix with the αs in different dotted boxes, changes neither the structural nor the performance symmetry. In other words, the programming does not change the value of α in the S-matrix.

To determine the number of programmable non-reciprocal states, one can first populate the top right submatrix, referred as sub-matrix A onward, with allowed permutations, which is N!. With each permutation of sub-matrix A, one can then examine the allowed permutations of sub-matrix B in the lower left quarter. Due to nonreciprocity of the network (Sij≠Sji), N components are determined as zero ("0") in sub-matrix B for a given permutation of sub-matrix A. Consequently, the number of ways to populate sub-matrix B for a given sub-matrix A is given by:

$$P(N \times N, N) = N! - C\frac{1}{N} \times (N-1)! + C\frac{2}{N} \times (N-2)! - C\frac{3}{N} \times (N-3)! + \ldots + (-1)^{N-1} \times C_N^{N-1} \times (-1)! + (-1)^N \times C_N^N$$

Thus, the number of nonreciprocal states, Ω, for a 2N-port network may be expressed as:

$$\Omega(2C) = (N!) \times P(N \times N, N)$$

As seen in FIG. 5B, this represents an exponential growth of programmable non-reciprocal states as the number of ports increases.

The loss in the disclosed network circuit 110 can be understood with an analytical approach focused on the switching loss, which is defined as the insertion loss caused by the switching process. Thus, when analyzing switching loss, the delay lines 114 are modeled as lossless and perfectly matched transmission lines. Fundamentally, the switching loss is the result of momentarily losing signal during the switching from one delay line 114 to another delay line 114. Such a loss is inevitable using switches with small but not zero switch on and off time.

In embodiment, the insertion loss due to switching is determined by how much signal is lost proportionally over time, and thus related to the ratio of switch time (ts) to delay time (δ). The switches are represented as time-varying resistances (Rswitch) during switching on and off periods. Thus, the switches linearly change resistance from an off-state resistance ($R_{off}$) to on-state resistance ($R_{on}$) over a switching period (ts) upon the application of control waveforms signals, which are assumed to be perfect square waves of 50% duty cycle. In a 2δ period, Rswitch can be described as:

$$R_{switch}(t) = \begin{cases} R_{off} + (R_{on} - R_{off}) \cdot \frac{t}{t_s} & \text{for } 0 < t \le t_s \\ R_{on} & \text{for } t_s < t \le 2\delta - t_s \\ R_{on} + (R_{off} - R_{on}) \cdot \frac{t - 2\delta + t_s}{t_s} & \text{for } 2\delta - t_s < t \le 2\delta \end{cases}$$

Consider the upper line in FIG. 2A, the input signal from 0<t<ts experiences a time-varying transmission coefficient of h(t) when transmitting through the switch controlled by L1. Then, this signal is delayed by δ, and from δ<t<δ+ts the signal experiences a transmission of h(t−δ) when transmitting through the switch controlled by R1. Given that switching time (ts) is smaller than δ, h(t) can be described as:

$$h(t) = \frac{2Z_0}{R_{switch}(t) + 2Z_0} \text{ for } 0 < t \le 2\delta$$

The transfer function between Port 1 to 2 as seen in FIG. 2A is given as:

$$H_{sys}(\omega) = H(\omega) \cdot e^{j\delta\omega} \cdot H(\omega - \delta) = H(\omega)^2$$

where H(ω) is the Fourier transform of h(t). It is noteworthy that when ts>0, the system transfer function has components other than the DC component. It implies that the non-ideal switching produces signals at frequencies other than the input signal (e.g., the carrier frequency), which is another interpretation of the switching loss. In addition, insertion loss is also introduced by $R_{on}$ and $R_{off}$. Thus, the total insertion loss (IL) between ports can be described as:

$$IL = -20\log_{10}\left(\frac{V_{out}}{V_{in}}\right) = -20\log_{10}H_{sys}(0)$$

Figure 6:
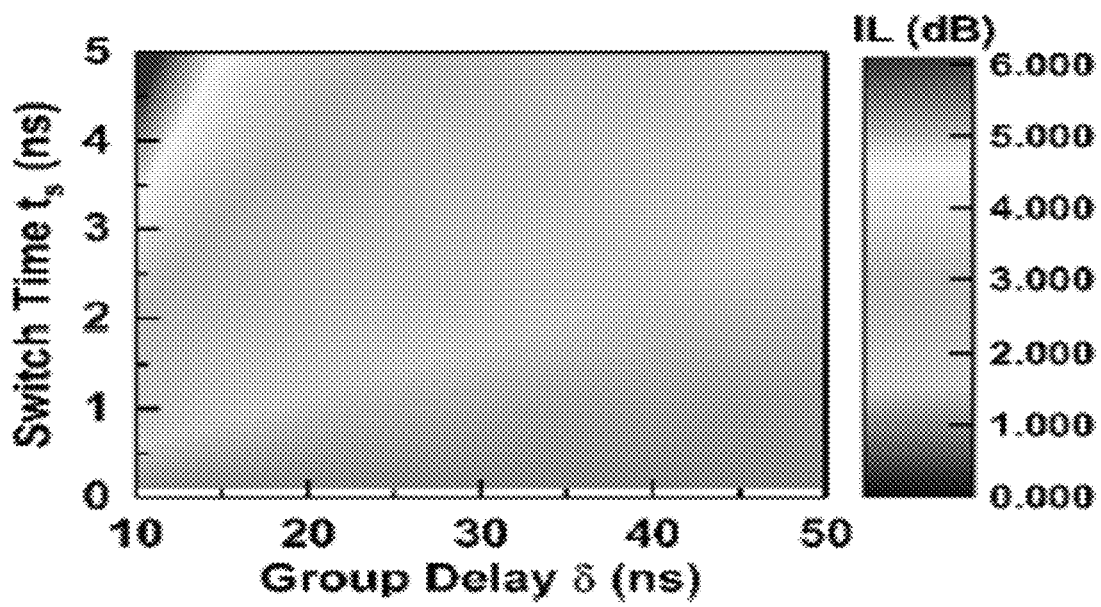
FIG. 6 is a graph illustrating dependence of switching loss on switching time and group delay of the 2N-port, delay line-based non-reciprocal network circuit of FIG. 1C according to an embodiment.

Based on the analytically closed form expression of switching loss as a function of ts and δ, a 2D contour plot of switching loss with switching time varying from 0 to 5 ns, and group delay of delay lines varying from 10 to 50 ns is plotted in FIG. 6. An $R_{on}$ of 6Ω and an $R_{off}$ of 120 kΩ are assumed for the switches used in the implementation. In the four-port circulator 300 implementation (FIG. 3A), two switch modules and two delay lines are employed. The switch modules are identical but 180° rotated from each other in the system assembly. For simplicity, the first switch module (with Port 1 and Port 3) will be discussed in detail here.

Figure 7A:
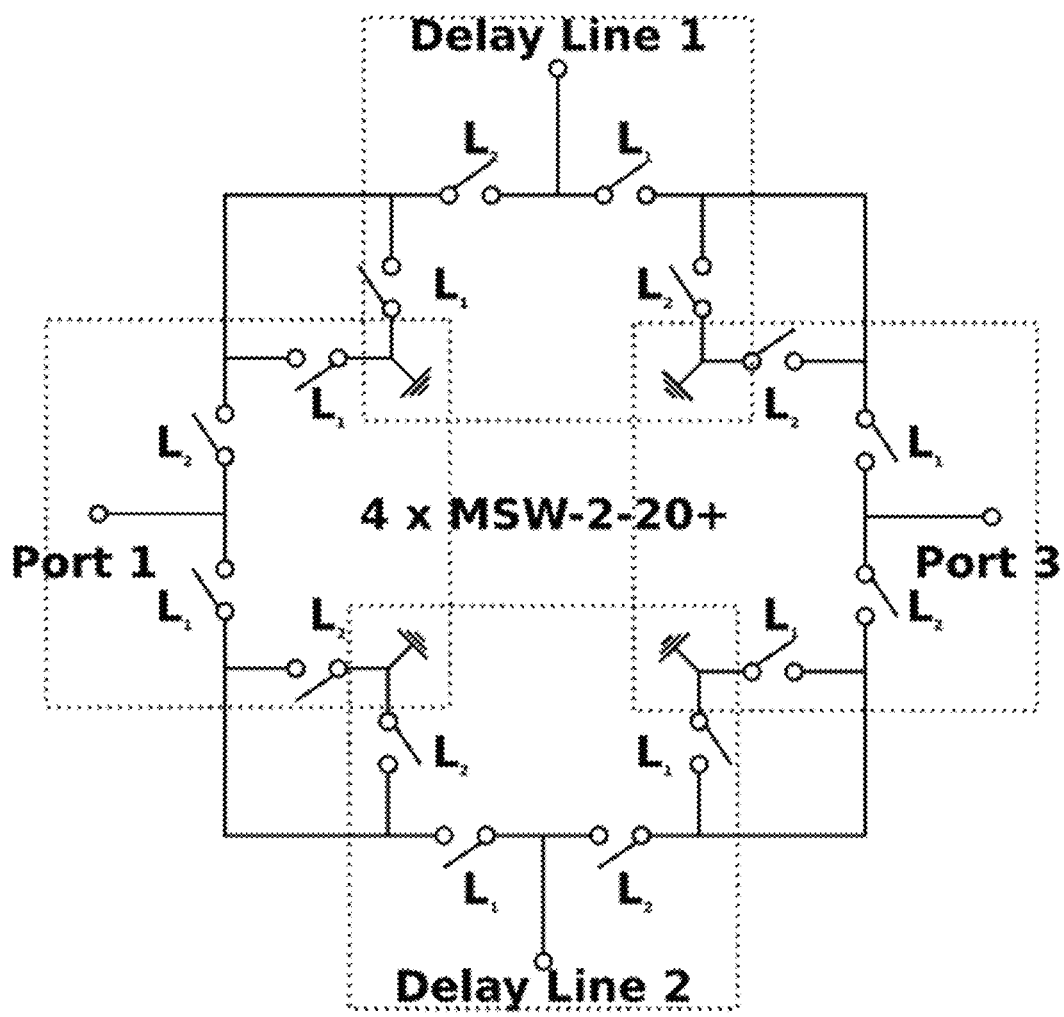
FIG. 7A is a schematic diagram of one of the two identical switching modules for switching the delay lines of the four-port circulator of FIG. 3A according to an embodiment.

FIG. 7A is a schematic diagram of a switching module for switching the delay lines of the four-port circulator 300 of FIG. 3A according to an embodiment. The switching module may be integrated within one switching board (FIG. 7B), of which there are two identical switching boards employed (FIG. 3A). Each switch module includes four single-pole, double-throw switches (SPDT, MSW-2-20+) that are interconnected between themselves and with two ports for the application of control signals (L1 and L2, 180° phase offset square waves), and four ports for routing the RF signals (Port 1, Port 3, Delay line 1, and Delay line 2). Different from the original schematic built on single-pole, single-throw (SPST) switches, two SPDT switches are connected in series to represent one SPST switch due to the lack of off-the-shelf open reflective SPST switches. In operation, due to the 180° phase offset, incident RF signals from Port 1 are sent to either Delay line 1 or Delay line 2, while incident RF signals from Port 3 are sent to the other of Delay line 1 and Delay line 2. The redundant switches connected to ground guarantee a great isolation between Ports 1 and 3 due to additional reflection induced by shorting to ground.

Figure 7B:
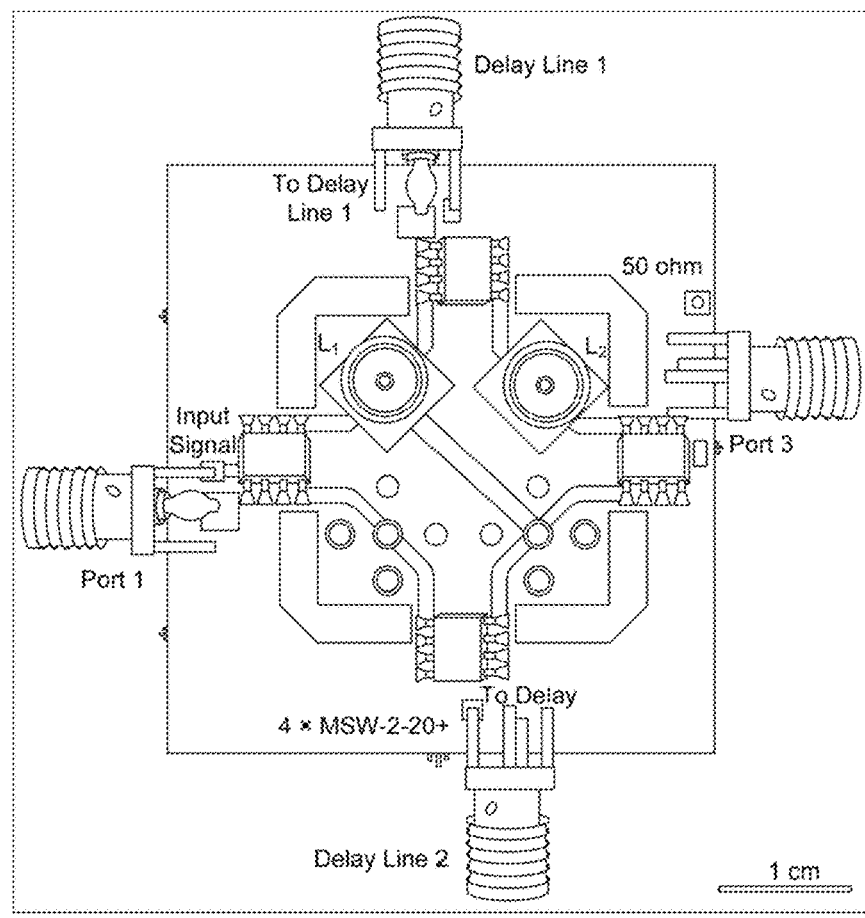
FIG. 7B is an image of a switch module, two of which are illustrated in FIG. 3A, according to an embodiment.

FIG. 7B is an image of a switch module, two of which are illustrated in FIG. 3A, according to an embodiment. The switch module is assembled on a 44.5-mm-wide, 1.6-mm-thick FR-4 printed circuit board (PCB), as shown in FIG. 7B. Two Amphenol ACX1230-ND sub-miniature type A connector (SMA) adapters are adopted for the control signal ports, while four Amphenol ACX 1652-ND SMA adapters are chosen for the RF signal ports. SMA types are selected for easier integration of the circulator system. The SMAs for control signals are placed near the center of the board to minimize undesired phase difference between control signals applied to switches, and to reduce the video leakage of the control signals into the RF paths. The dimensions of RF signal interconnections between switches have been optimized to attain a low insertion loss for the switch modules.

Figure 7C:
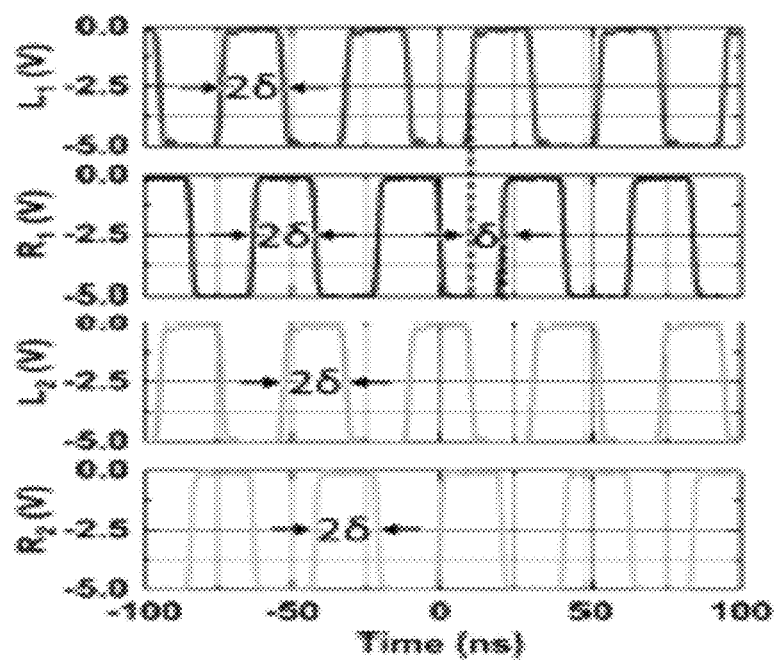
FIG. 7C is a graph with switch control signals for system level measurement and produced by a switching control signal generator according to an embodiment.

FIG. 7C is a graph with switch control signals for system level measurement and produced by an switching control signal generator according to an embodiment. As seen in FIG. 7C, the control signals are generated by two synchronized Tektronix AFG3000 arbitrary function generators (AFGs), used for purposes of experimentation. The control waveform signals generated may be 23.8 MHz square waves with an amplitude of 0 V to −5 V in accordance with the delay δ (10.5 ns) imposed by the delay lines 114 of the disclosed non-reciprocal network circuit 110. The rise time of each signal may be about 2 ns. The control signals L1 and L2 or R1 and R2 are 180° offset in phase, while L1 and R1, as well as L2 and R2, is 90° offset in phase. The loss caused by the switching modules have been experimentally identified with a Keysight N5249A performance network analysis (PNA). The loss from port 1 to either delay line 1 or delay line 2, when the switches at Port 1 are constantly turned on, is characterized to be 1.1 dB at 10 MHz. The loss is mainly from the insertion loss of the switches, 0.5 dB insertion loss for each switch. When the time varying control signals as seen in FIG. 7C are applied to the switches, the loss from port to delay lines is increased to 2.5 dB at 10 MHz. The measured loss agrees with the analysis of the switching loss shown in FIG. 6.

Figure 8:
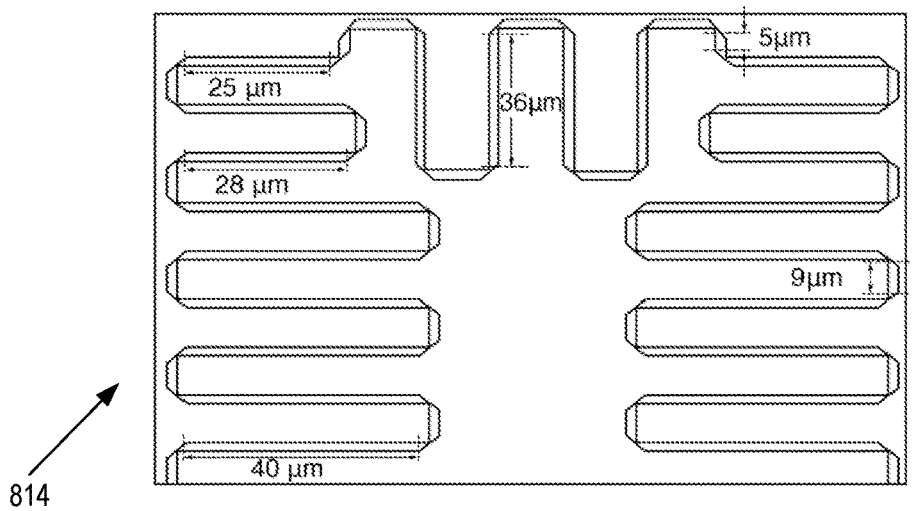
FIG. 8 is an image of the layout of a set of microstrip delay lines according to an embodiment.

FIG. 8 is an image of the layout of a set of microstrip delay lines 814 according to an embodiment. The delay lines are implemented based microstrip transmission lines on a Duroid board (6010.2LM) with a total length of 1071 mm. The substrate has a dielectric constant of 10.2 and a low loss tangent of 0.0023 up to 10 GHz. The large dielectric constant serves to minimize the phase velocity of wave propagation in the microstrip, and hence reduces the size for a given group delay. As seen in FIG. 8, a meandering layout with optimized bends, is adopted to further reduce size and remove unwanted parasitic resonances below 1 GHz. The coupling between adjacent sections of meandering microstrip has been optimized to minimize unwanted ripple response in the group delay and insertion loss below 1 GHz. Optimization and modeling are done with ADS momentum signals.

Figure 9A:
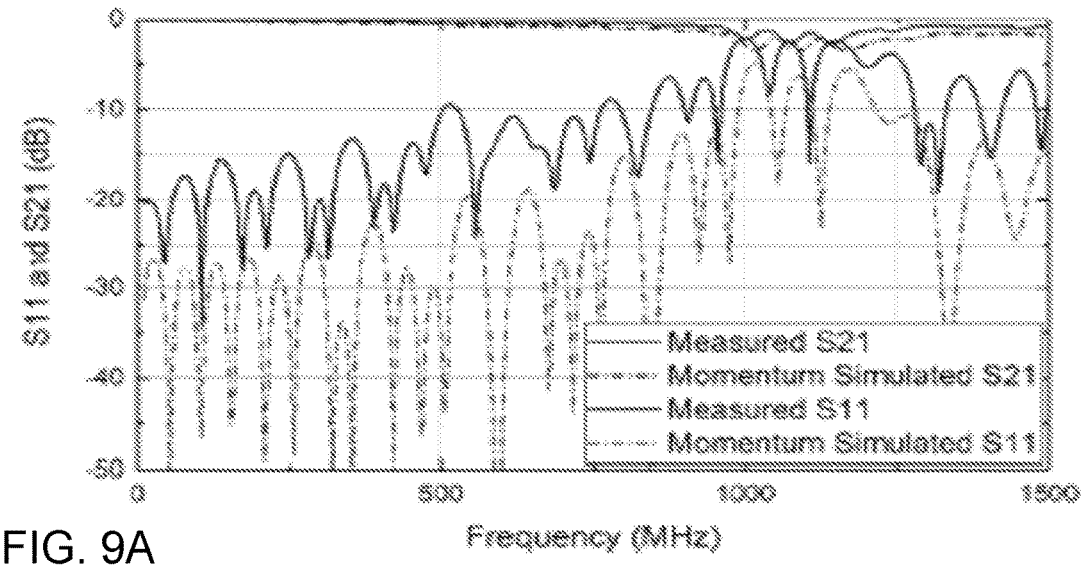
FIG. 9A is a graph illustrating measurement and momentum simulation of S11 and S21, ports 1 and 2 upon excitation of port 1 of the four-port circulator of FIG. 3A, according to an embodiment.
Figure 9B:
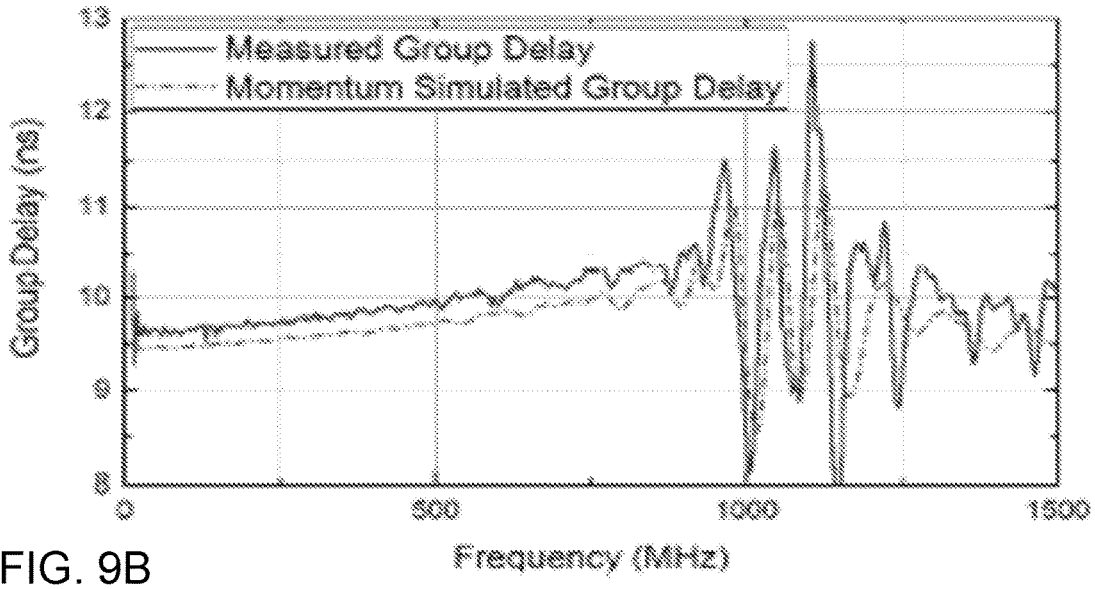
FIG. 9B is a graph illustrating group delay of the set of microstrip delay lines of FIG. 8 according to an embodiment.

FIG. 9A is a graph illustrating measurement and momentum simulation of S11 and S21, ports 1 and 2 upon excitation of port 1 of the four-port circulator 300 of FIG. 3A, according to an embodiment. FIG. 9B is a graph illustrating group delay of the set of microstrip delay lines 814 of FIG. 8 according to an embodiment. The fabricated delay lines are tested before they are assembled with the switching modules. The measurement reference planes are moved to the SMA connectors in calibration. The measurement results are shown in FIG. 9A, in comparison with the simulated results. The measurement results exhibit reasonable agreement with Momentum simulation in terms of insertion loss and group delay. An insertion loss less than −2 dB is obtained, for a group delay around 10 ns below 1 GHz. Therefore, the insertion loss per unit delay is better than −0.06 dB/ns below 1 GHz. The measured return loss is higher than the simulated one. This is expected as the simulation does not include the effect of the SMA connectors. As predicted by simulation, the set of microstrip delay lines 814 show worst return loss at 1 GHz and slight dispersion below 1 GHz, due to unwanted reflections in the adopted meandering layout of the set of microstrip delay lines 814.

This disclosure demonstrates the first non-reciprocal network based on switched low-loss acoustic delay lines. A 21 dB nonreciprocal contrast between insertion loss (IL=6.7 dB) and isolation (28.3 dB) has been achieved over a fractional bandwidth of 8.8% at a center frequency 155 MHz, using a record low switching frequency of 877.22 kHz. The four-port circulator 300 (FIG. 3A) is built upon a newly reported framework of the disclosed non-reciprocal network circuit 110, but using two in-house fabricated low-loss, wide-band lithium niobate (LiNbO$_3$) delay lines with single-phase unidirectional transducers (SPUDT) and commercially available switches. Such a system can potentially lead to future wide-band, low-loss chip-scale nonreciprocal RF systems with unprecedented programmability. In additional embodiments, such delay lines are alternatively made of aluminum nitride or scandium-doped aluminum nitride.

Microwave frequency non-reciprocal networks, e.g., circulators and isolators, have been investigated for full-duplexing radios. Non-reciprocity is conventionally achieved by Faraday effect in ferrite materials. Recently, magnet-free non-reciprocal systems based on modulation of reactance or conductance have been demonstrated. Despite promising performance, these demonstrations require either a physically large structure for long delays or a high-frequency modulation signals due to the fast phase velocity of electromagnetic waves. Moreover, the bandwidth of non-reciprocity is limited by the modulation frequency and required phase matching condition. To overcome their limitations, we harness shear horizontal acoustic waves in a lithium niobate thin film to produce long delays (280 ns) with insertion loss below 4 dB over 1-mm size. As mentioned, this thin film may also be made of aluminum nitride or scandium-doped aluminum nitride. Combining with the disclosed frequency independent framework, this work has achieved wideband non-reciprocity employing unprecedentedly low temporal effort, e.g., in terms of frequency and depth.

FIG. 10A is a schematic diagram illustrating a four-port circulator 1000 with two acoustic delay lines 1014, e.g., a first acoustic delay line 1014A and a second acoustic delay line 104B according to an embodiment. The four-port circulator 1000 may include a first set of SPST switches 1018A and a second set of SPST switches 1018B, each controlled by one of four control signals. FIG. 10B is a graph of the switch control signals applied to the network circuit of the four-port circulator 1000 of FIG. 10A according to an embodiment.

In embodiments, the first and second sets of switches 1018A and 1018B are controlled by four control signals illustrated in FIG. 10B, with a period (4δ) that is four times the group delay of the delay lines 1014. Control signals on opposite sides of the delay lines are offset by S. In operation, the input signals flowing into Port 1 are time-multiplexed onto the two delay lines 1014 and subsequently de-multiplexed, as delayed input signals, to Port 2 by turning on the second set of switches 1018A coupled to Port 2 at a time (δ) after the input signals launched from Port 1. The time-reversal symmetry is broken through sequentially timing the switching from a first end of the delay lines 1014 to a second end of the delay lines 1014. Consequently, input signals fed to Port 2 are rejected by the first set of switches 1018A closing signal access to Port 1, but may be received by Port 3. The assembled circulator performance is simulated (FIG. 10B) with the control signal frequency set to 877.2 kHz to match the group delay. An insertion loss of 5.6 dB and an isolation of 30 dB is obtained.

FIG. 10C is a block diagram of the four-port circulator 1000 of FIG. 10A with switching modules, impedance matching circuits, and unidirectional acoustic delay lines, according to an embodiment. Experimentally, we implemented two standalone switch boards and one delay line board, and assembled them as the four-port circulator 1000 seen in FIG. 10C. The switch board design schematic and the constructed board are shown in FIGS. 7A, 7B, and 7C.

FIGS. 11A and 11B are images of a pair of fabricated acoustic delay lines with single-phase unidirectional transducers (SPUDT). A pair of distributed acoustic reflection transducers (DARTs) are arranged on both ends of suspended lithium niobate thin film or other suspended thin film. For lowering the insertion loss of the delay lines 1014, inductor-capacitor (LC) circuits are used to match the impedance to 50Ω, as seen in FIG. 11C. FIG. 11D is an image of FR-4 board on which the delay lines (FIGS. 11A and 11B) and the matching networks (FIG. 11C) are disposed according to an embodiment. Design parameters of the four-port circulator 1000 are included in Table 1.

TABLE 1

| LN Thickness | Cell Type | Wavelength | No. of Cells |
|---|---|---|---|
| 700 nm | DART | 20 μm | 10 |
| Au Thickness | Aperture | Gap | Orientation |
| 100 nm | 200 μm | 1000 μm | −10 degree to +Y |

On the delay line board, the pair of in-house fabricated SPUDT lithium niobate acoustic delay lines were wire-bonded to the LC matching networks.

FIGS. 12A, 12B, 12C, and 12D are graphs to illustrate measured (solid) and simulate (dashed) S-parameters and group delay of the impedance-matched delay line A, respectively FIGS. 12A-12B, and of the impedance-matched delay line B, respectively FIGS. 12C-12D, according to embodiments. Measured and simulated S-parameters and group delays of the delay line board are shown in FIGS. 12A, 12B, 12C, and 12D. Four ("4") dB insertion loss and around 280 ns group delay are measured.

FIG. 13A is an image of an experimental setup of a four-port circulator, including two switch boards and a delay line board, according to one embodiment. FIG. 13B is a graph that illustrates S-parameters obtained from the Advanced Design System (ADS) in simulation according to an embodiment. In the simulation, 2 ns switching time and on-state insertion loss of the switches are considered. Control signals are set to be 877.2 kHz (1.14 μs period).

FIGS. 14A, 14B, 14C, and 14D are graphs illustrating measured S-parameter performance of the four-port circulator as simulated in FIG. 13B, respectively: when port is excited (14A), port two is excited (14B), port three is excited (14C), and port four is excited (14D), according various embodiments. As illustrated, the measured S-parameters exhibit great performance symmetry between ports, a minimum insertion loss around 6.7 dB, and an isolation larger than 27 dB over a bandwidth of 13.6 MHz (8.7% fractional BW). Directivity larger than 21 dB is obtained between the forward and backward propagation path (e.g., between S12 and S21). Return loss is better than 15 dB at each port. The measurement is carried out at −10 dBm power level. Control signals are set to be 877.2 kHz (1.14 μs period). Currently, the loss is limited by insufficient directionality in the SPUDT design and impedance matching network, which will be significantly reduced by further optimization on acoustic delay lines.

Figures 15A, 15B, 15C, 15D:
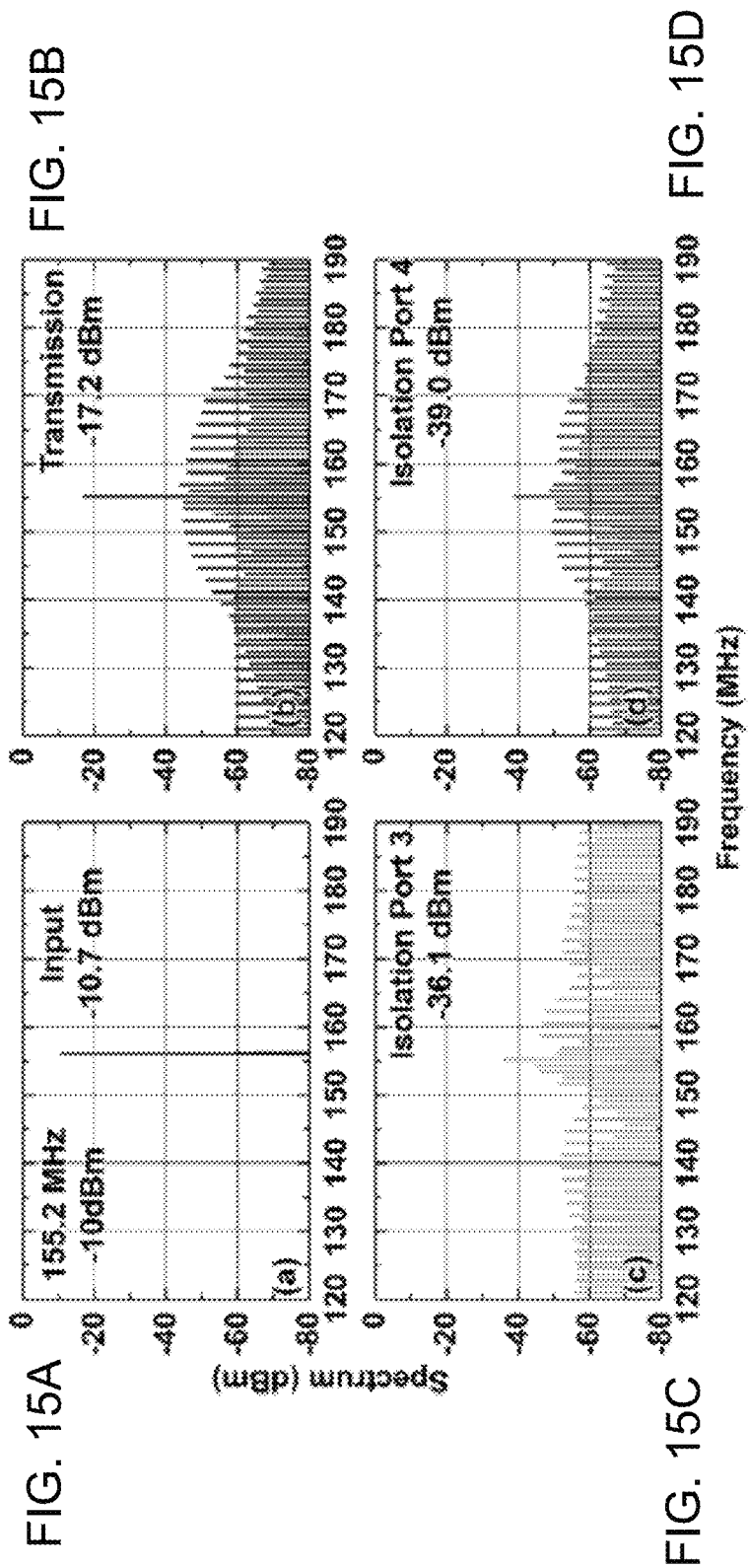
FIG. 15A is a graph of the measured spectral content of the experimental four-port circulator according to an embodiment.
FIG. 15B is a graph of the transmitted signal at port two, showing 6.5 dB insertion loss, according to an embodiment.
FIG. 15C is a graph of the transmitted signal at port three, indicating 25.4 dB insertion loss, according to an embodiment.
FIG. 15D is a graph of the transmitted signal at port four, indicating 28.3 dB insertion loss, according to an embodiment.

In various embodiments, the spectral contents of different ports are measured when port 1 is excited by a single tone, the results of which are illustrated in FIGS. 15A through 15D. FIG. 15A is a graph of measured spectral content of the experimental four-port circulator according to an embodiment. FIG. 15B is a graph of the transmitted signal at port two, showing 6.5 dB insertion loss, according to an embodiment. FIG. 15C is a graph of the transmitted signal at port three, indicating 25.4 dB insertion loss, according to an embodiment. FIG. 15D is a graph of the transmitted signal at port four, indicating 28.3 dB insertion loss at port 4, according to an embodiment. The inter-modulated tones are caused by the non-ideal switching and multi-reflection on the delay lines exist in the spectrum, which can be significantly diminished using a differential structure.

Figure 16:
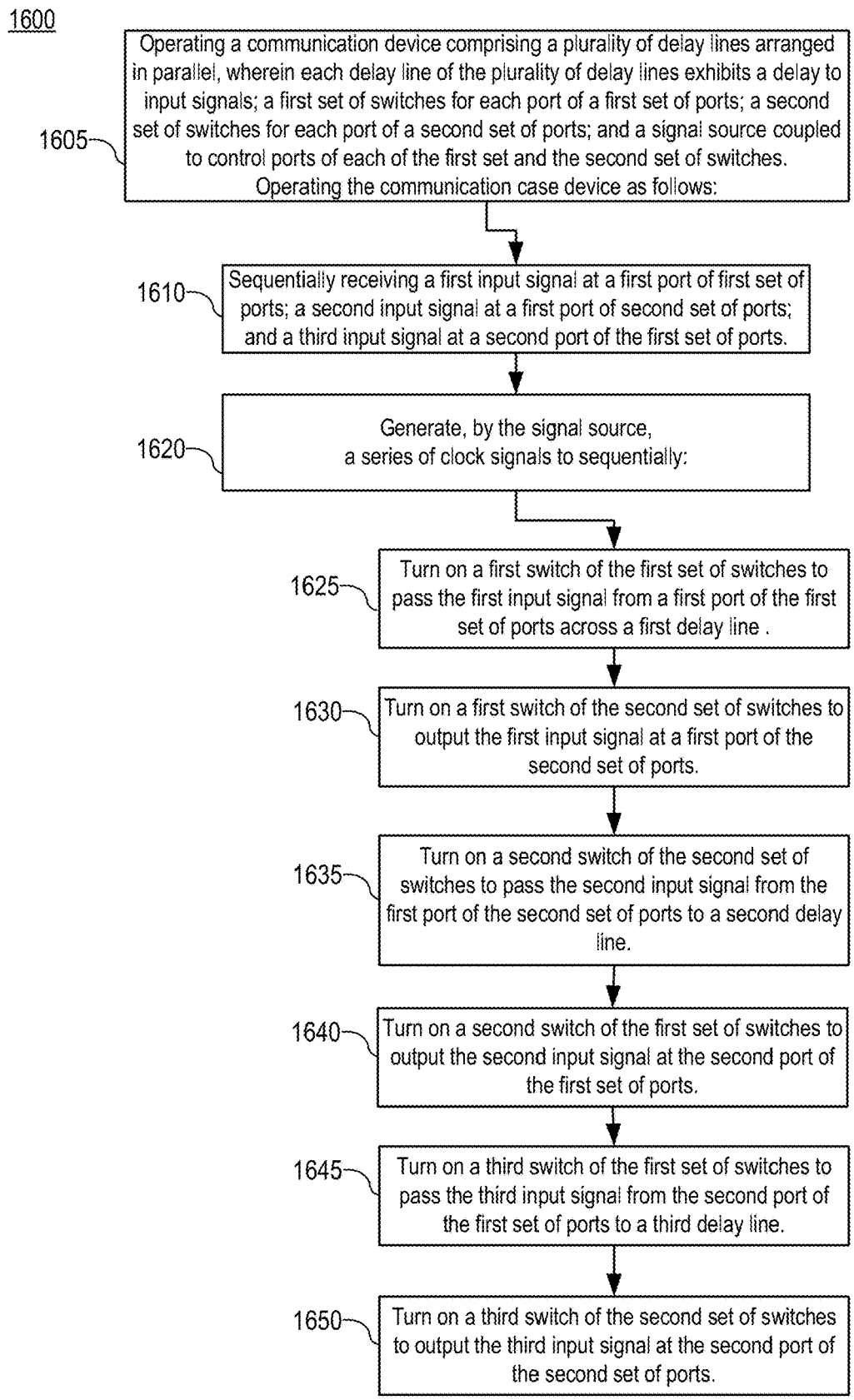
FIG. 16 is a flow chart of a method for operating a circulator employing a 2N-port, delay line-based non-reciprocal network circuit, according to an embodiment.

FIG. 16 is a flow chart of a method 1600 for operating a circulator employing the 2N-port, delay line-based non-reciprocal network circuit, according to an embodiment. The method 1600 may begin by operating a communication device having multiple delay lines arranged in parallel, where each delay line of the multiple delay lines exhibits a delay to input signals (1605). The communication device may further include a first set of switches for each port of a first set of ports, each switch of the first set of switches to selectively couple a port of the first set of ports to first ends of the delay lines (1605). The communication device may further include a second set of switches for each port of the second set of ports, where each switch of the second set of switches is to selectively couple a port of the second set of ports to second ends of the plurality of delay lines (1605). The communication device may further include a signal source coupled to control ports of each of the first set and the second set of switches (1605).

In various embodiments, the method 1600 may further include sequentially receiving a first input signal at a first port of the first set of ports, a second input signal at a first port of the second set of ports, and a third input signal at a second port of the first set of ports (1610). The method 1600 may continue with generating, by the signal source, a series of clock signals (1620). The series of clock signals may be to sequentially: turn on a first switch of the first set of switches of a first port of the first set of ports to pass the first input signal from the first port of the first set of ports across a first delay line of the plurality of delay lines (1625); turn on a first switch of the second set of switches of a first port of the second set of ports to output the first input signal at the first port of the second set of ports (1630); turn on a second switch of the second set of switches of the first port of the second set of ports to pass the second input signal from the first port of the second set of ports to a second delay line of the plurality of delay lines (1635); turn on a second switch of the first set of switches of a second port of the first set of ports to output the second input signal at the second port of the first set of ports (1640); turn on a third switch of the first set of switches of a second port of the first set of ports to pass the third input signal from the second port of the first set of ports to a third delay line of the plurality of delay lines (1645); and turn on a third switch of the second set of switches of a second port of the second set of ports to output the third input signal at the second port of the second set of ports (1650).

In one embodiment, the first input signal, the second input signal, and third input signal come from separate input feeds, e.g., in the case of MIMO. In another embodiment, the first input signal, the second input signal, and third input signal are time-multiplexed portions of an identical input signal. In some embodiments, the series of clock signals is further to sequentially turn on the first switch of each of the first set of switches, $C(t,1,1)$ to $C(t,1,N)$, to circulate a last input signal from a last port of the second set of ports to the first port of the first set of ports.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. An apparatus comprising:
    a plurality of delay lines arranged in parallel, wherein each delay line of the plurality of delay lines causes a delay to input signals, and wherein the plurality of delay lines comprise more than four identical delay lines;
    a first set of switches for each port of a first set of ports, wherein each switch of the first set of switches is to selectively couple a port of the first set of ports to first ends of the plurality of delay lines;
    a second set of switches for each port of a second set of ports, wherein each switch of the second set of switches is to selectively couple a port of the second set of ports to second ends of the plurality of delay lines; and
    a signal source coupled to control ports of each of the first set of switches and the second set of switches, the signal source to generate a series of clock signals that are sequentially time delayed between the first set of switches and the second set of switches,
    wherein an input signal at one of the first set or second set of ports travels from the one of the first set or second set of ports, respectively, to an opposite port of the first set and second set of ports, consecutively in opposite directions over at least some of the plurality of delay lines according to activation of the first set and second set of switches, and is output at an output port of the first set and second set of ports.

2. The apparatus of claim 1, wherein the input signal is time-multiplexed onto to the at least some of the plurality of delay lines.

3. The apparatus of claim 1, wherein the signal source comprises:
    a first signal generator to generate a first set of the series of clock signals, of which each on period lasts twice the delay, which are applied to each of the first set of switches; and
    a second signal generator to generate a second set of the series of clock signals, of which each on period lasts twice the delay, which are applied to each of the second set of switches, wherein the first and second signal generators are synchronized.

4. The apparatus of claim 3, wherein the first set of ports are sequentially odd-numbered ports (m) and the second set of ports are sequentially even-numbered ports (m+1), and wherein the first set of the series of clock signals are generated to comprise $C(t,m,n)$ clock signals and the second set of the series of clock signals are generated to comprise $C(t,m+1,n)$ clock signals, where t represents time, and where n represents sequential delay line number of the plurality of delay lines.

5. The apparatus of claim 4, wherein respective ones of the first set of the series of clock signals are sequenced numerically according to m port number of the first set of ports, and respective ones of the second set of the series of clock signals are sequenced numerically according to m+1 port number of the second set of ports.

6. The apparatus of claim 4, wherein at least one clock signal of the first set of the series of clock signals is sequenced numerically out of order of m port number of the first set of ports, and a corresponding at least one clock signal of the second set of the series of clock signals is sequenced numerically out of order of m+1 port number of the second set of ports.

7. The apparatus of claim 4, wherein the series of clock signals is further to sequentially turn on a first switch of each of the first set of switches, C(t,1,1) to C(t,1,N), to circulate a last input signal from a last port of the second set of ports to a first port of the first set of ports.

8. The apparatus of claim 1, wherein the first set and the second set of switches are single pole, multiple throw switches.

9. The apparatus of claim 1, wherein the plurality of delay lines are electromagnetic delay lines.

10. The apparatus of claim 1, wherein the plurality of delay lines are acoustic delay lines, further comprising:
   a first pair of distributed acoustic reflection transducers (DARTs) coupled to each first end of the plurality of delay lines; and
   a second pair of DARTs coupled to each second end of the plurality of delay lines.

11. The apparatus of claim 10, wherein the first pair and the second pair of DARTs are disposed at the first end and the second end, respectively, of suspended thin film made of one of lithium niobate, aluminum nitride, or scandium-doped aluminum nitride for each of the plurality of delay lines.

12. A radio frequency transceiver comprising:
   an antenna;
   a receiver;
   a transmitter; and
   a non-reciprocal device coupled between the antenna, the receiver, and the transmitter, the non-reciprocal device comprising:
      a plurality of delay lines arranged in parallel, wherein each delay line of the plurality of delay lines causes a delay to input signals, and wherein the plurality of delay lines comprise more than four identical delay lines;
      a first set of switches for each port of a first set of ports, wherein each switch of the first set of switches is to selectively couple a port of the first set of ports to first ends of the plurality of delay lines;
      a second set of switches for each port of a second set of ports, wherein each switch of the second set of switches is to selectively couple a port of the second set of ports to second ends of the plurality of delay lines; and
      a signal source coupled to control ports of each of the first set of switches and the second set of switches, the signal source to generate a series of clock signals that are sequentially time delayed between the first set of switches and the second set of switches,
      wherein an input signal at one of the first set or second set of ports travels from the one of the first set or second set of ports, respectively, to an opposite port of the first set and second set of ports, consecutively in opposite directions over at least some of the plurality of delay lines according to activation of the first set and second set of switches, and is output at an output port of the first set and second set of ports.

13. The radio frequency transceiver of claim 12, wherein the input signal is time-multiplexed onto to the at least some of the plurality of delay lines.

14. The radio frequency transceiver of claim 12, wherein the signal source comprises:
   a first switching control signal generator to generate a first set of the series of clock signals, of which each on period lasts twice the delay, which are applied to each of the first set of switches; and
   a second switching control signal generator to generate a second set of the series of clock signals, of which each on period lasts twice the delay, which are applied to each of the second set of switches, wherein the first and second switching control signal generators are synchronized.

15. A method comprising:
   operating a communication device comprising a plurality of delay lines arranged in parallel, wherein each delay line of the plurality of delay lines exhibits a delay to input signals, and wherein the plurality of delay lines comprise more than four identical delay lines; a first set of switches for each port of a first set of ports, wherein each switch of the first set of switches is to selectively couple a port of the first set of ports to first ends of the plurality of delay lines; a second set of switches for each port of a second set of ports, wherein each switch of the second set of switches is to selectively couple a port of the second set of ports to second ends of the plurality of delay lines; and a signal source coupled to control ports on the first set and the second set of switches, wherein operating the communication device comprises:
      receiving an input signal at one of the first set or second set of ports;
      generating, by the signal source, a series of clock signals that are sequentially time delayed between the first set of switches and the second set of switches;
      sequentially activating the first set and second set of switches with the series of clock signals to cause the input signal to travel from the one of the first set or second set of ports, respectively, to an opposite port of the first set and second set of ports, consecutively in opposite directions over at least some of the plurality of delay lines; and
      outputting the input signal at an output port of the first set and second set of ports.

16. The method of claim 15, wherein the signal source comprises a first signal generator and a second signal generator, the method further comprising:
   generating, with the first signal generator, a first set of the series of clock signals, of which each on period lasts twice the delay;
   applying the first set of the series of clock signals to each of the first set of switches;
   generating, with the second signal generator, a second set of the series of clock signals, of which each on period lasts twice the delay;
   applying the second set of the series of clock signals to each of the second set of switches; and
   synchronizing the first signal generator with second signal generator.

17. The method of claim 16, wherein the first set of ports are sequentially odd-numbered ports (m) and the second set of ports are sequentially even-numbered ports (m+1), and wherein the first set of the series of clock signals are generated to comprise C(t,m,n) clock signals and the second set of the series of clock signals are generated to comprise C(t,m+1,n) clock signals, where t represents time, and where n represents sequential delay line number of the plurality of delay lines.

18. The method of claim 17, wherein respective ones of the first set of the series of clock signals are sequenced numerically according to m port number of the first set of ports, and respective ones of the second set of the series of clock signals are sequenced numerically according to m+1 port number of the second set of ports.

19. The method of claim 17, wherein at least one clock signal of the first set of the series of clock signals is sequenced numerically out of order of m port number of the first set of ports, and a corresponding at least one clock signal of the second set of the series of clock signals is sequenced numerically out of order of m+1 port number of the second set of ports.

20. The method of claim 17, wherein the series of clock signals is further to sequentially turn on a first switch of each of the first set of switches, C(t,1,1) to C(t,1,N) to circulate a last input signal from a last port of the second set of ports to a first port of the first set of ports.

* * * * *